US012796405B2

(12) United States Patent
Choi

(10) Patent No.: US 12,796,405 B2
(45) Date of Patent: Nov. 10, 2026

(54) METHOD INCLUDING POSITIONING A DUMMY SOURCE DIE OR A DESTINATION SITE TO COMPENSATE FOR OVERLAY ERROR

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 365 days.

(21) Appl. No.: 18/491,552

(22) Filed: Oct. 20, 2023

(65) Prior Publication Data

US 2025/0132206 A1 Apr. 24, 2025

(51) Int. Cl.
*H10P 74/00* (2026.01)
*H10W 80/00* (2026.01)

(52) U.S. Cl.
CPC ............ *H10P 74/23* (2026.01); *H10P 74/277* (2026.01); *H10W 80/163* (2026.01); *H10W 80/211* (2026.01); *H10W 80/312* (2026.01); *H10W 80/327* (2026.01)

(58) Field of Classification Search
CPC ...... H10P 74/23; H10P 74/277; H10P 74/207; H10P 74/232; H10P 72/53; H10P 74/273; H10P 74/00; H10P 72/50; H10W 80/312211; H10W 80/327; H10W 80/163; H10W 80/312; H10W 80/00
See application file for complete search history.

(56) References Cited

U.S. PATENT DOCUMENTS

| | | | |
|---|---|---|---|
| 7,550,835 | B2 | 6/2009 | Kang |
| 9,236,367 | B1 | 1/2016 | Chen |
| RE45,932 | E | 3/2016 | Fujii |

(Continued)

FOREIGN PATENT DOCUMENTS

| | | | | |
|---|---|---|---|---|
| WO | WO-2008053524 A1 * | 5/2008 | | ............. H10P 74/23 |
| WO | 2022212260 A1 | 10/2022 | | |

(Continued)

OTHER PUBLICATIONS

English Translation of Keizo (Year: 2008).*

(Continued)

*Primary Examiner* — Wael M Fahmy
*Assistant Examiner* — Thomas Wilson Mccoy
(74) *Attorney, Agent, or Firm* — Abel Schillinger, LLP

(57) ABSTRACT

A method can include bonding a dummy source die to a first destination site of a destination substrate, wherein the dummy source die has a metrology pattern, and the first destination site has a metrology pattern. The method can further include collecting radiation data regarding at least portions of the metrology pattern and the metrology pattern within a radiation area, wherein collecting the radiation data is performed after bonding the dummy source die to the first destination site. The method can include analyzing the radiation data to determine an overlay error between the dummy source die and the first destination site; and adjusting a position of a known good source die or a second destination site of the destination substrate to compensate for the overlay error between the dummy source die and the first destination site.

17 Claims, 23 Drawing Sheets

(56) References Cited

U.S. PATENT DOCUMENTS

| | | | | |
|---|---|---|---|---|
| 11,309,223 | B2 | 4/2022 | Yu | |
| 11,469,217 | B2 | 10/2022 | Arai | |
| 11,552,074 | B2 | 1/2023 | Chen | |
| 11,631,647 | B2 | 4/2023 | Haba | |
| 11,862,599 | B2 * | 1/2024 | Chen | H10P 52/00 |
| 2016/0047744 | A1 * | 2/2016 | Adel | G01B 11/272 356/243.1 |
| 2020/0294870 | A1 * | 9/2020 | Yu | H10P 74/273 |
| 2020/0343218 | A1 * | 10/2020 | Hu | H10W 90/00 |
| 2021/0082870 | A1 * | 3/2021 | Wu | H10P 72/74 |
| 2021/0129265 | A1 * | 5/2021 | Nomaru | B23K 26/0608 |
| 2021/0320038 | A1 | 10/2021 | Hsu | |
| 2022/0082944 | A1 * | 3/2022 | Rehman | G03F 7/705 |
| 2022/0189830 | A1 * | 6/2022 | Beyne | H10P 74/203 |
| 2023/0070459 | A1 * | 3/2023 | Prince | B01L 3/502784 |
| 2023/0245996 | A1 | 8/2023 | Sreenivasan | |
| 2025/0112097 | A1 * | 4/2025 | Schulze-Ollmert | H10P 74/273 |
| 2025/0132285 | A1 * | 4/2025 | Choi | H10P 74/203 |

FOREIGN PATENT DOCUMENTS

| | | | |
|---|---|---|---|
| WO | 2023056068 | A1 | 4/2023 |
| WO | 2023056072 | A1 | 4/2023 |

OTHER PUBLICATIONS

Muth, et al.; "Absorption Coefficient and Refractive Index of GaN, AlN And AlGaN Alloys"; MRS Internet J. Nitride Semicond. Res. 4S1, G5.2; Cambridge Univ. Press (1999), pp. 1-6.

Edmund Optics Worldwide; "The Correct Material for Infrared (IR) Applications"; accessed Sep. 13, 2023, pp. 1-5.

AdValue Technology; "Technical Information Single Crystal Sapphire"; 2015, pp. 1-4.

* cited by examiner

METHOD INCLUDING POSITIONING A DUMMY SOURCE DIE OR A DESTINATION SITE TO COMPENSATE FOR OVERLAY ERROR

RELATED APPLICATION

This application is related to U.S. patent application Ser. No. 18/491,556 entitled "Method Including Positioning a Source Die or a Destination Site to Compensate for Overlay Error" by Choi filed of even date, which is assigned to the current assignee hereof and incorporated herein by reference in its entirety.

FIELD OF THE DISCLOSURE

The present disclosure relates to methods including adjusting a position a source die or a destination site to compensate for overlay error between a previously bonded dummy source die and a different destination site.

RELATED ART

Advanced packaging technologies demand high throughput and precise placement of dies. Hybrid bonding can be particularly challenging with small misalignment tolerances. An apparatus can include a bridge and a base, where a bonding head, alignment hardware, and an alignment reference can be coupled to the bridge, and a carriage is coupled to the base. A destination substrate chuck and alignment hardware can be coupled to the carriage. During a hybrid bonding sequence, a source die is held by the bonding head, and a destination substrate is held by the destination substrate chuck. The amount of misalignment can be measured for the source die separately from the destination substrate chuck. Some compensation can be made for the misalignment but there is no end-point sensing, and overlay error may be greater than desired. A need exists for better overlay error measurement.

SUMMARY

A method can include bonding a first dummy source die to a first destination site of a destination substrate, wherein the first dummy source die has a first dummy source metrology pattern, and the first destination site has a first destination metrology pattern. The method can further include collecting first radiation data regarding at least portions of the first dummy source metrology pattern and the first destination metrology pattern within a first radiation area, wherein collecting the first radiation data is performed after bonding the first dummy source die to the first destination site; analyzing the first radiation data to determine a first overlay error between the first dummy source die and the first destination site; and adjusting a position of a known good source die or a second destination site of the destination substrate to compensate for the first overlay error between the first dummy source die and the first destination site.

In another implementation, the method further includes irradiating the first radiation area with a radiation. Within the first radiation area, the first dummy source metrology pattern includes a relatively transmissive portion with respect to the radiation and a relatively non-transmissive portion with respect to the radiation. The relatively transmissive portion of the first dummy source metrology pattern includes a substrate, and the relatively non-transmissive portion of the first dummy source metrology pattern includes the substrate and dummy source alignment marks, wherein at least one of the dummy source alignment marks is disposed along a bonding surface of the first dummy source die. The dummy source alignment marks are only within the relatively non-transmissive portion, and no dummy source alignment mark of the first dummy source metrology pattern is within the relatively transmissive portion.

In a particular implementation, the first destination metrology pattern comprises destination alignment marks. During irradiating, no more than 25% of the radiation is transmitted through the destination alignment marks.

In a more particular implementation, during bonding, at least one of the dummy source alignment marks does not contact any of the destination alignment marks.

In another implementation, the method further includes irradiating the first radiation area with a radiation. The first radiation area includes at least part of each of the first dummy source metrology pattern and the first destination metrology pattern. Within the first radiation area, the first dummy source metrology pattern includes a relatively transmissive portion with respect to the radiation and a relatively non-transmissive portion with respect to the radiation. With respect to the radiation, a difference in transmission percentages between the relatively transmissive portion and the relatively non-transmissive portion is at least 25%.

In still another implementation, the method further includes irradiating the first radiation area with a radiation. Within the first radiation area, the first dummy source metrology pattern includes a relatively transmissive portion with respect to the radiation and a relatively non-transmissive portion with respect to the radiation. During irradiating, no more than 25% of the radiation is transmitted through the relatively non-transmissive portion, and at least 75% of the radiation is transmitted through all of the relatively transmissive portion.

In yet another implementation, the method further includes irradiating the first radiation area with infrared radiation.

In a further implementation, collecting the first radiation data is performed using a radiation and a radiation detector, wherein the radiation detector has a depth of focus of at most 9 μm with respect to the radiation.

In another implementation, the destination substrate includes a known good destination die and a bad destination die, and the first destination site is at least part of the bad destination die.

In a particular implementation, the method further includes bonding the known good source die to the second destination site of the destination substrate after adjusting the position of the known good source die or the second destination site, wherein the second destination site is at least part of the known good destination die.

In another particular implementation, the method further includes bonding a second dummy source die to a third destination site of the destination substrate, wherein the second dummy source die has a second dummy source metrology pattern, and the third destination site die has a second destination metrology pattern. The method further includes collecting second radiation data regarding at least portions of the second dummy source metrology pattern and the second dummy source metrology pattern within a second radiation area; and analyzing the second radiation data to determine a second overlay error between the second dummy source die and the third destination site. Bonding the second dummy source die, collecting the second radiation data, and analyzing the second radiation data are performed after adjusting the position of the known good source die or the second destination site.

In another implementation, the first dummy source metrology pattern comprises a first dummy source alignment mark.

In a particular implementation, the first destination metrology pattern comprises a first destination alignment mark.

In another particular implementation, the first destination metrology pattern comprises a set of contact pads that is not a part of an alignment mark.

In a further implementation, the first dummy source metrology pattern and the first destination metrology pattern comprise areas including arrays of corresponding contact pads.

In a particular implementation, the array of contact pads of the first dummy source metrology pattern is phase shifted by an angle in a range from 90° to 270° relative to the array of contact pads of the first destination metrology pattern.

In another particular implementation, the array of contact pads of the first dummy source metrology pattern is phase shifted by an angle in a range of 150° to 210° relative to the array of contact pads of the first destination metrology pattern.

In another implementation, analyzing comprises analyzing the first radiation data using spatial frequency analysis.

In a particular implementation, the first dummy source metrology pattern, the first destination metrology pattern, or each of the first dummy source metrology pattern and the first destination metrology pattern has a pitch and size of a feature corresponding to the pitch. The first dummy source metrology pattern, the first destination metrology pattern, or each of the first dummy source metrology pattern and the first destination metrology pattern has a pitch and a size of a feature corresponding to the pitch corresponds to a value of a spatial frequency. A quotient is the pitch divided by the size of the feature corresponding to the pitch, and the value is the quotient+/−10% of the quotient and is in a range from 1.5 to 9.0.

In a further implementation, analyzing the first radiation data comprises analyzing a pattern of a first image generated from the first radiation data as compared to a pattern of a standard image.

BRIEF DESCRIPTION OF THE DRAWINGS

Implementations are illustrated by way of example and are not limited to the accompanying figures.

Figure 1:
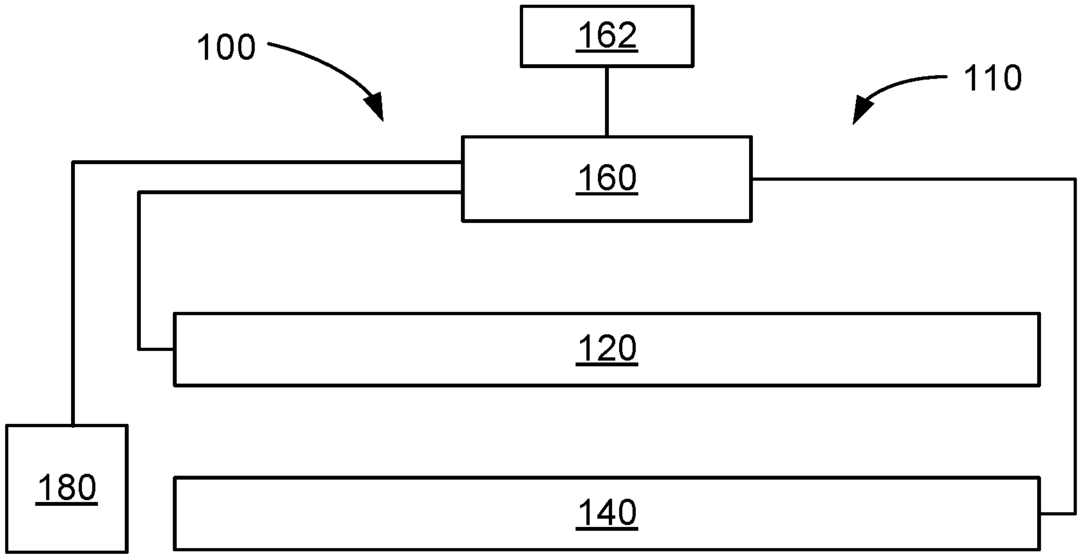
FIG. 1 includes a conceptual, high-level view of a system that can be used in transferring dies to a destination substrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

A dummy source die can be bonded to a first destination site of a destination substrate. The dummy source die and first destination site can include metrology patterns. Radiation data regarding at least portions of the metrology patterns can be collected and analyzed to determine an overlay error between the dummy source die and the first destination site. During a subsequent die bonding, a position of a known good source die or a second destination site of the destination substrate can be adjusted to compensate for the overlay error between the dummy source die and the first destination site.

The dummy source die does not have any electrical circuit element that is electrically connected to an electrical circuit element within the destination substrate. Accordingly, the dummy source die may not have interconnects or other features that could interfere when collecting radiation data after the dummy source die is bonded to the first destination site.

The analysis of radiation data has many options. The analysis may or may not include generating an image. When an image is to be generated, further refinements may or may not be used to improve the image. The imaging may be performed with a range of focus that can focus on the alignment marks within the dummy source die and the destination die and produce an image where electrical circuit elements and interconnects in the destination die are not in focus or are blurred out. Pattern recognition may be used so that electrical circuit elements and interconnects below the contact pads in the destination die are not considered when determining an overlay error. Further, spatial frequency analysis can also be used when imaging or when determining the overlay error.

If needed or desired, the metrology patterns can be designed so that alignment marks within one of the metrology patterns do not overlap alignment marks within the other metrology pattern. Ideally, the alignment marks within one of the metrology patterns is 180° out of phase from the alignment marks within the other metrology pattern. The overlay error may correspond to how far alignment marks within one of the metrology patterns are away from being 180° out of phase from the alignment marks within the other metrology pattern.

More than one dummy source die can be bonded to the destination substrate and provide information regarding drift of the apparatus, whether or not there is center-to-edge variation or other positional relationship regarding overlay error with respect to where on the destination substrate the source die is bonded, or the like.

The methods can be performed by a system that can be in the form of an apparatus or can include a combination of an apparatus and a die loading machine or another apparatus used in hybrid bonding dies. The systems and methods of using the systems are better understood with the description below in conjunction with the corresponding figures.

Figure 2:
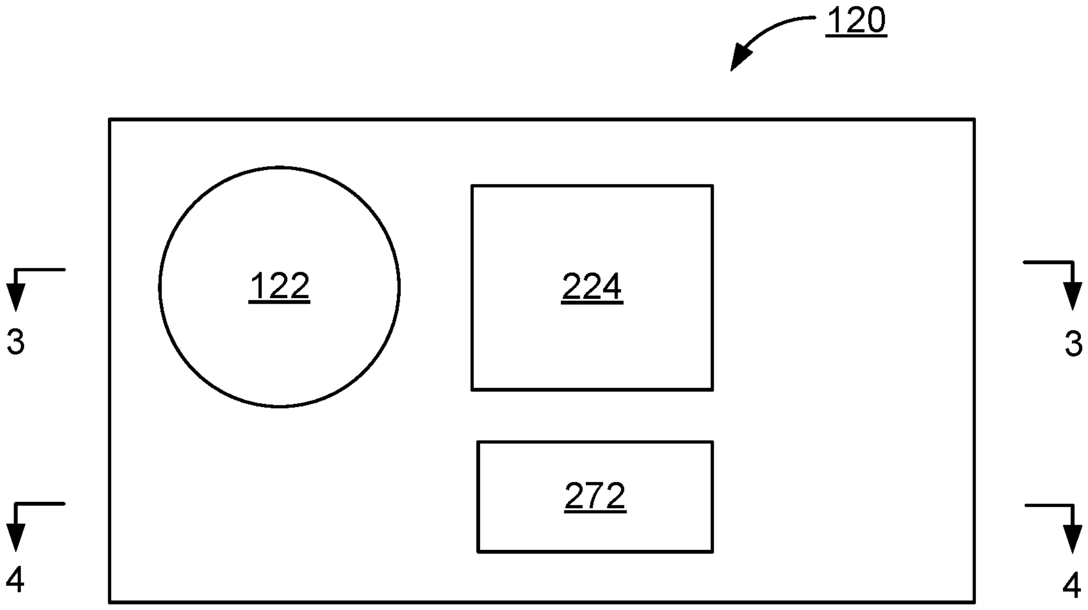
FIG. 2 includes a bottom view of a bridge of an apparatus within the system of FIG. 1.
Figure 3:
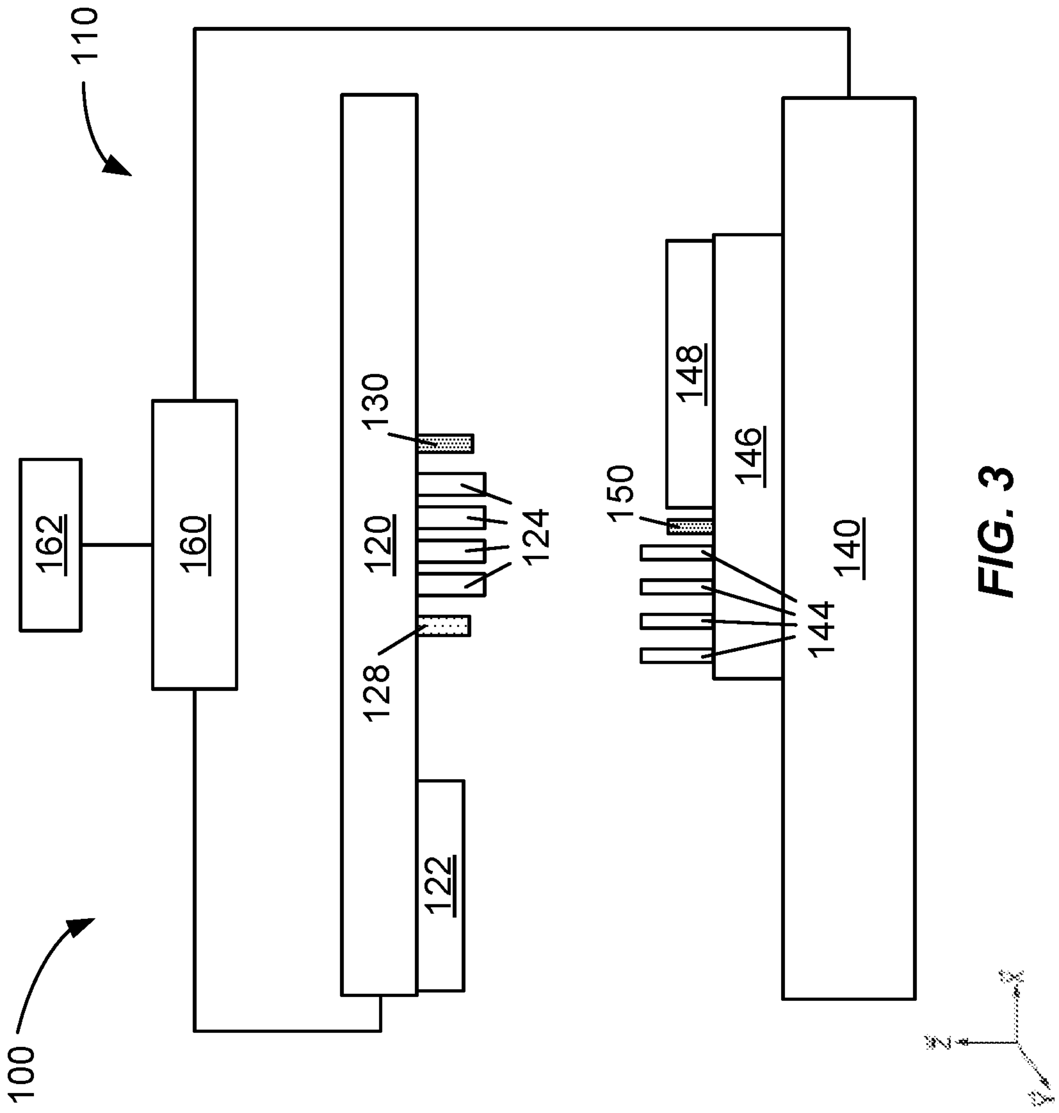
FIG. 3 includes an illustration of a cross-sectional view of the apparatus in FIG. 1 as seen along sectioning line 3-3 in FIG. 2.
Figure 4:
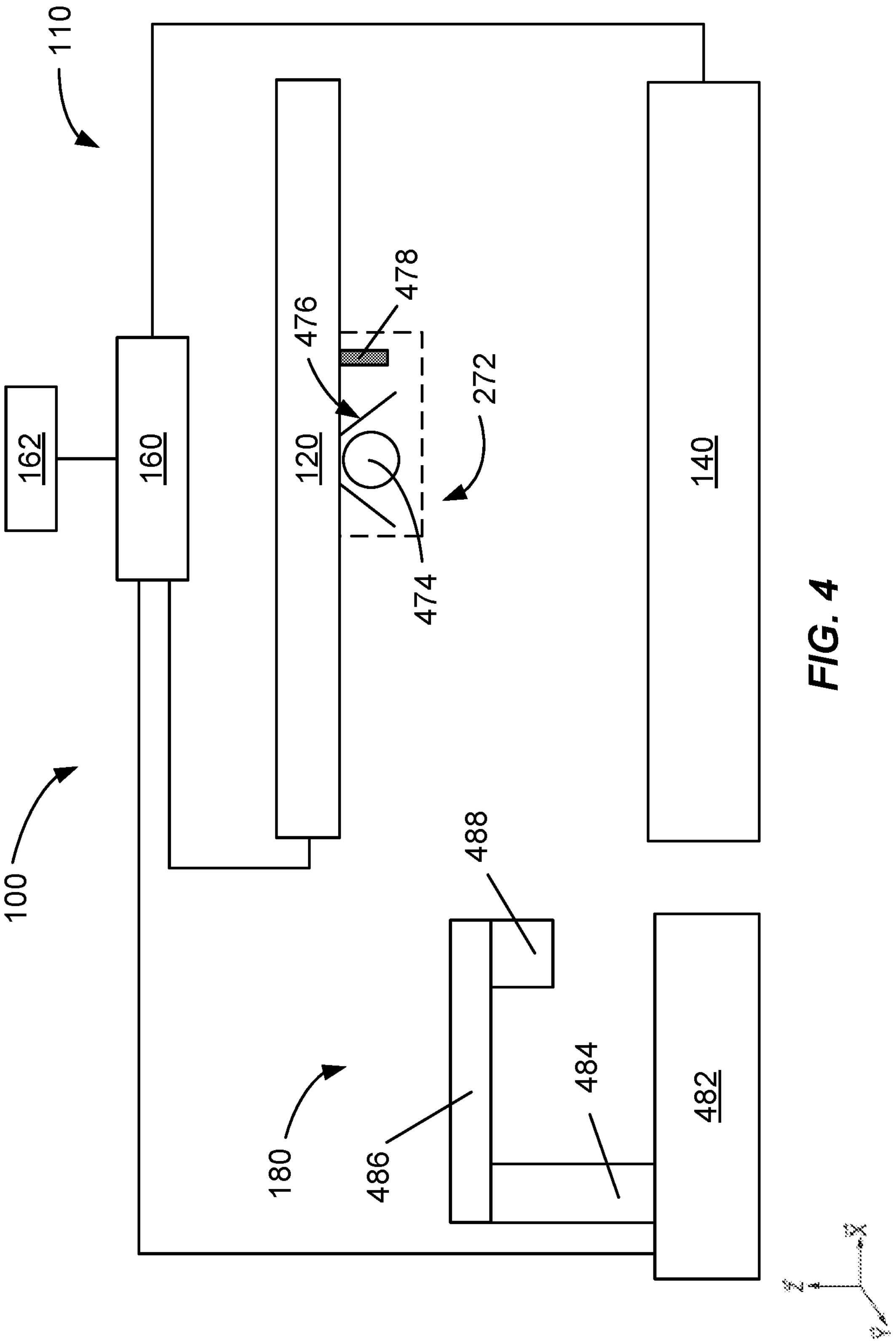
FIG. 4 includes an illustration of a cross-sectional view of a die loading machine and the apparatus in FIG. 1, wherein the apparatus is illustrated along sectioning line 4-4 in FIG. 2.

FIGS. 1 to 4 include conceptual diagrams of a system 100 that can include an apparatus 110 and a die loading machine 180. The system 100 can be used to transfer a plurality of dies to a destination substrate. FIG. 1 includes a high-level diagram of the system 100, and FIG. 2 includes a bottom view of a bridge 120. In FIG. 2, a sectioning line 3-3 corresponds to FIG. 3, and a sectioning line 4-4 corresponds to FIG. 4. FIG. 3 includes a cross-sectional view of the apparatus 110 to illustrate components used in transferring a plurality of dies to a destination substrate. FIG. 4 includes cross-sectional view of the system 100 that includes a radiation tool 272 within the apparatus 110 and the die loading machine 180. FIGS. 1 to 4 illustrate equipment making up the system 100 and does not illustrate the plurality of dies or the destination substrate. The die and destination substrate will be illustrated with respect to process flow diagrams described later in this specification.

Referring to FIGS. 1 to 3, in an implementation, the apparatus 110 includes a bridge 120, a base 140, a controller 160, and a memory 162. The controller 160 can be coupled to the bridge 120, the base 140, one or more components coupled to the bridge 120 or the base 140, or a combination thereof. Each of the bridge 120 and the base 140 can be a support structure. The bridge 120 can be coupled to a source substrate chuck 122, an array of bonding heads 124, an alignment reference 128, and an optical component 130. The base 140 can be coupled to a carriage 146.

In FIGS. 3 and 4, the bridge 120, the base 140, and components physically coupled to the bridge 120 or the base 140, and the die loading machine 180 can be organized along an X-direction, a Y-direction, a Z-direction, or a combination thereof. With respect to FIGS. 3, 4, and other cross-sectional or side views in the figures, the X-direction is between the left-hand and right-hand sides of the figure, the Z-direction is between the top and bottom of the figure, and the Y-direction is into and out of the drawing sheet. Unless explicitly stated to the contrary, rotation occurs along a X-Y plane defined by the X-direction and Y-direction.

The source substrate chuck 122 can be a vacuum chuck, pin-type chuck, a groove-type chuck, an electrostatic chuck, an electromagnetic chuck, or the like. The source substrate chuck 122 can be coupled to the bridge 120 by being attached to the bridge 120 directly or can be coupled to the bridge 120 via a carriage (not illustrated). The source substrate chuck 122 has a source holding surface that faces the base 140 or a component coupled to the base 140.

FIG. 2 includes a bottom view of the bridge 120 to illustrate general locations for the source substrate chuck 122, a region 224 that includes the array of bonding heads, the alignment reference, and the optical component, and a radiation tool 272. The radiation tool 272 is addressed later in this specification.

FIG. 3 illustrates the array of bonding heads 124. The array of bonding heads 124 can be configured as a vector (a row or a column of bonding heads), or as a matrix (at least two rows and at least two columns of bonding heads), or as a staggered array. The number of bonding heads within the array of bonding heads 124 may be different between rows, between columns, or between rows and columns. Some array configurations can be 3×1, 6×1, 2×2, 2×3, 2×4, 4×2, 10×10, or another rectangular shape, where the first number corresponds to the number of bonding heads along a row or column, and the second number corresponds to the number of bonding heads along the other of the row or column.

Each of the bonding heads within the array of bonding heads 124 can include a die chuck and a body disposed between the die chuck and the bridge 120. Each of die chucks can be a vacuum chuck, pin-type chuck, a groove-type chuck, an electrostatic chuck, an electromagnetic chuck, a Bernoulli chuck, or the like. Alternatively, the die chucks can be contactless die chucks, where the die chucks contact the lateral sides, and not the device side or back side, of a die. The device side is a side of the die where electrical components are formed, the back side of the die is opposite the device side, and the lateral sides are disposed between the device and back sides of the die. When a die includes a thru-substrate via (TSV), the TSV may be exposed along the back side of the die. Contactless chucks can help to reduce the likelihood that an activated surface for bonding contacts the bonding head. In an implementation, the device side, the back side, or both the device side and back side can have activated surface(s). The lateral sides may not be activated for bonding.

The bonding heads may be configured such that the die chucks have a limited range of motion relative to their corresponding bodies to provide better positioning when dies are transferred from the array of bonding heads 124 to a destination substrate (not illustrated in FIGS. 1 to 4) coupled to a destination substrate chuck 148. Each bonding head may include a positioning stage which move each bonding head independently in one or more directions of X-direction, Y-direction, Z-direction, tip, tilt, and rotation.

Referring to FIG. 3, the alignment reference 128 is coupled to the bridge 120. The alignment reference 128 can include marks or other features that can help with proper positioning of the carriage 146 with respect to the bridge 120 or a component coupled to the bridge 120. The alignment reference 128 and an optical component 150 can be used during an alignment operation. More details regarding the optical component 150 are described below with respect to components coupled to the base 140.

The optical component 130 is coupled to the bridge 120 and can be used to determine a pitch of the array of die transfer seats 144. The optical component 130 may also be used to confirm the presence of or identity of a die (for example, a part number or type of die) coupled to a die transfer seat within the array of die transfer seats 144 or a destination substrate coupled to the destination substrate chuck 148. If needed or desired, more than one optical component 130 may be coupled to the bridge 120. The optical component 130 may also be used to determine positions of destination sites of the destination substrate coupled to the destination substrate chuck 148.

The carriage 146 is coupled to the base 140. The carriage 146 can be a positioning stage and provide translating motion along the base 140 in the X-direction, Y-direction, or Z-direction or rotational motion about one or more of axes, such as rotation about a Z-axis and along a plane lying along the X-direction and Y-direction.

The array of die transfer seats 144 are coupled to the carriage 146. The array of die transfer seats 144 have bodies and die chucks. The bodies are coupled to the carriage 146. The bridge 120 or a component coupled to the bridge 120 is closer to the die chucks than to the bodies of die transfer seats within the array of die transfer seats 144. In an implementation, any one or more of the die transfer seats can have a die chuck that can be of any type described with respect to the array of bonding heads 124. The die transfer seats and the bonding heads may be of the same type or different types. In an implementation, the die transfer seats within the array of die transfer seats 144 can be pick-up heads.

The array of die transfer seats 144 can be configured as a vector (a row or a column of pick-up heads), or as a matrix (at least two rows and at least two columns of pick-up heads), or as a staggered array. Regarding the matrix, the number of bonding heads within the array of die transfer seats 144 may be different between rows, between columns, or between rows and columns. Some array configurations can be 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column.

In theory, dies from an entire source wafer may be transferred all at once. From a top view, for such a configuration, the array of die transfer seats 144 will have fewer pick-up heads along rows closer to the top and bottom of the array as compared to the row or the pair of rows closest to the center of the array, and the array of die transfer seats 144 will have fewer pick-up heads along columns closer to the left-side and right-side of the array as compared to the column or the pair of columns closest to the center of the array. After reading this specification, skilled artisans will be able to determine an array configuration for the array of die transfer seats 144 that meets the needs or desires for a particular application.

The array of die transfer seats 144 can be configured to have an adjustable pitch that can be reversibly changed between a source-matching pitch and the bonding head-matching pitch. The array of die transfer seats 144 or the carriage 146 can include motors, electrical components or the like that can be activated to move die transfer seats to achieve a desired pitch. In an implementation, the array of die transfer seats 144 can be at the source-matching pitch when picking up a set of dies coupled to the source substrate chuck 122 and at the bonding head-matching pitch when transferring the set of dies to the array of bonding heads 124. After the dies are transferred to the array of bonding heads 124, the pitch for the array of die transfer seats 144 can be changed back to the source-matching pitch before picking up more dies.

The terms "transfer operation" and "transfer cycle" are addressed to aid in understanding implementations as described herein. A transfer operation starts no later than loading a first set of dies on the array of die transfer seats 144 and ends with a last set of dies bonded to destination sites of a destination substrate overlying the destination substrate chuck 148. A transfer cycle starts no later than loading a set of dies onto the array of die transfer seats 144 until that same particular set of dies is bonded to the destination sites of the destination substrate that is coupled to the destination substrate chuck 148. A transfer operation can include one or more transfer cycles.

In an implementation, die transfer seats within the array of die transfer seats 144 do not need to be pick-up heads. The die transfer seats within the arrays of die transfer seats 144 may or may not be able to extend in the Z-direction (toward the bridge 120 or a component coupled to the bridge 120). Dies can be loaded onto die transfer seats within the arrays of die transfer seats 144 by the die loading machine 180. Alternatively, the dies can be loaded manually by a human operator.

The optical component 150 in FIG. 3 is coupled to the carriage 146 and can be used during alignment operations. The optical component 150 can be part of registration and alignment hardware used in aligning the carriage 146 to the alignment reference 128, identifying dies that would be held by the array of bonding heads 124, positioning bonding heads, measuring misalignment error of dies that would be held by the array of bonding heads 124, or the like. The optical component 150 can include a lens that is optically coupled to a mirror, a prism, a grating, a light source, a fiber optic cable, an aperture, a tube, a camera, or a combination thereof.

Referring to FIG. 3, the destination substrate chuck 148 can be coupled to the carriage 146 that is coupled to the base 140. In an implementation, the destination substrate chuck 148 is attached to the carriage 146. The destination substrate chuck 148 can hold a destination substrate including destination sites. The destination substrate chuck 148 can be a vacuum chuck, pin-type chuck, a groove-type chuck, an electrostatic chuck, an electromagnetic chuck, or the like. The destination substrate chuck 148 can be heated, cooled, or both heated and cooled. The destination substrate chuck 148 can include a heater (not illustrated). In the same or different implementation, a fluid (not illustrated) can flow through the destination substrate chuck 148 to increase or decrease the temperature of the destination substrate chuck 148.

Referring to FIGS. 1 and 4, the die loading machine 180 can be used to load the die transfer seats of the apparatus 110. The die loading machine 180 may be used in place of or in conjunction with the source substrate chuck 122. For example, none, some, or all dies to be bonded to a destination substrate can be coupled to a source substrate that is coupled to the source substrate chuck 122, and none, some, or all die to be bonded to the destination substrate can be placed on die transfer seats 144 by the die loading machine 180.

The die loading machine 180 can be a robot, a pick-and-place tool, or the like. Referring to FIG. 4, the die loading machine 180 can include a base 482, a positioning shaft 484, a positioning arm 486, and a die transfer head 488. The positioning shaft 484 can move in the X-direction, Y-direction, or both the X-direction and Y-direction. The positioning shaft 484 may or may not be configured to extend or retract in the Z-direction. The positioning arm 486 can be oriented and rotate along a plane defined by the X-direction and Y-direction. The positioning arm 486 may or may not be configured to extend or retract in a direction from or toward the positioning shaft 484. The die transfer head 488 can obtain one die or a plurality dies from a source substrate (not illustrated in FIG. 4) or from another die location and transfer the die or plurality of dies to the plurality of die transfer seats 144 (illustrated in FIG. 3) in the apparatus 110.

Referring to FIGS. 1 to 4, the system 100 can be operated using a controller 160 in communication with the bridge 120, any component coupled to the bridge 120, the base 140, any component coupled to the base 140, the die loading machine 180, or any combination thereof. The controller 160 can operate using a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 110. In another implementation (not illustrated), the controller 160 can be at least part of a computer external to the apparatus 110, where such computer is bidirectionally coupled to the system 100. The memory 162 can include a non-transitory computer readable medium that includes instructions to carry out the actions associated with or between transfer operations. The memory 162 may include data that is used or obtained when performing the method. In another implementation, the bridge 120, a component coupled to the bridge 120, the base 140, a component coupled to the base 140, or the die loading machine 180 can include a local controller that provides some of the functionality that would otherwise be provided by the controller 160.

Figure 5:
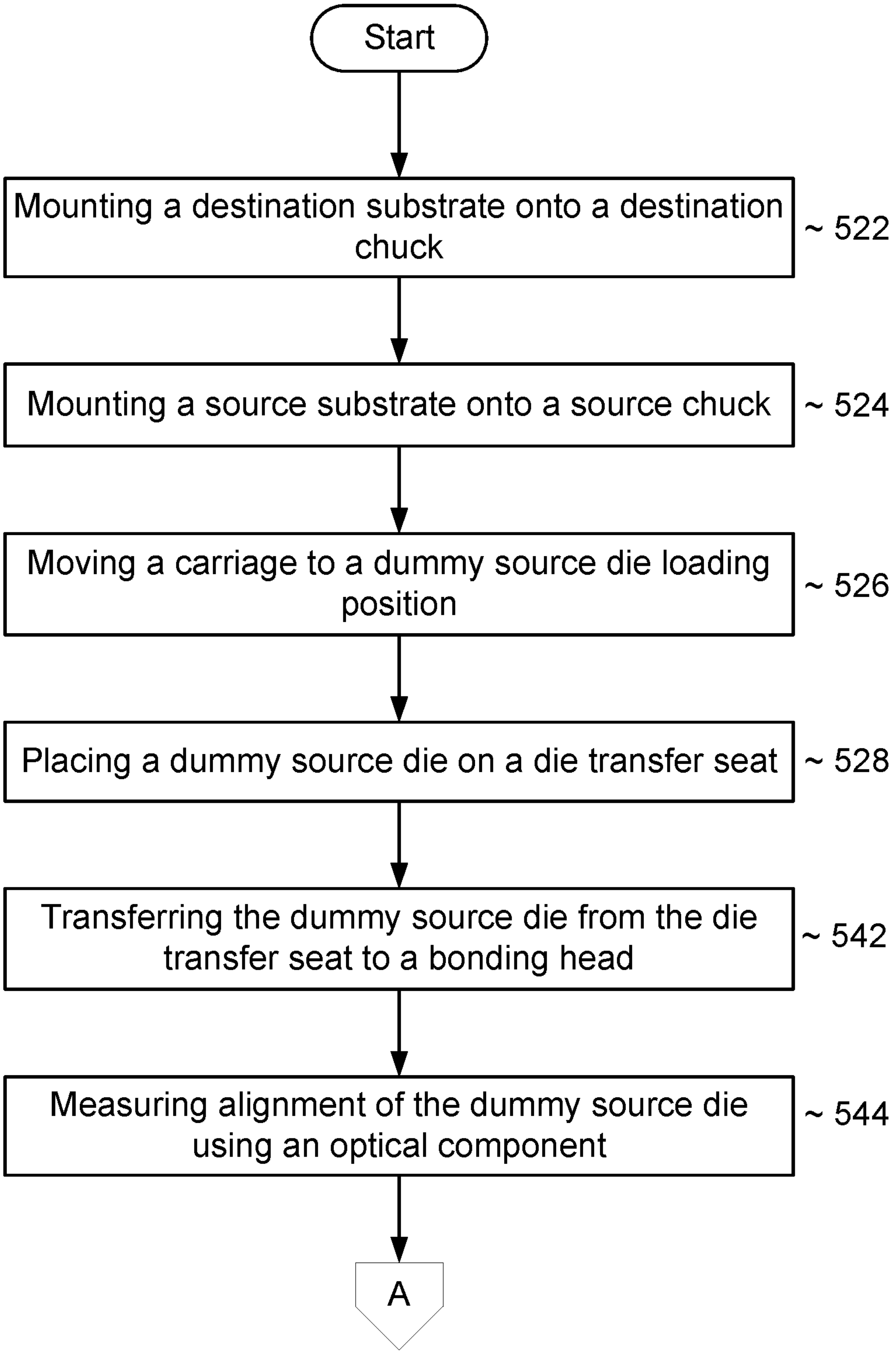
FIGS. 5 and 6 include a process flow diagram for determining an overlay error compensation corresponding to an overlay error between a dummy source die and its corresponding destination site of a destination substrate.
Figure 6:
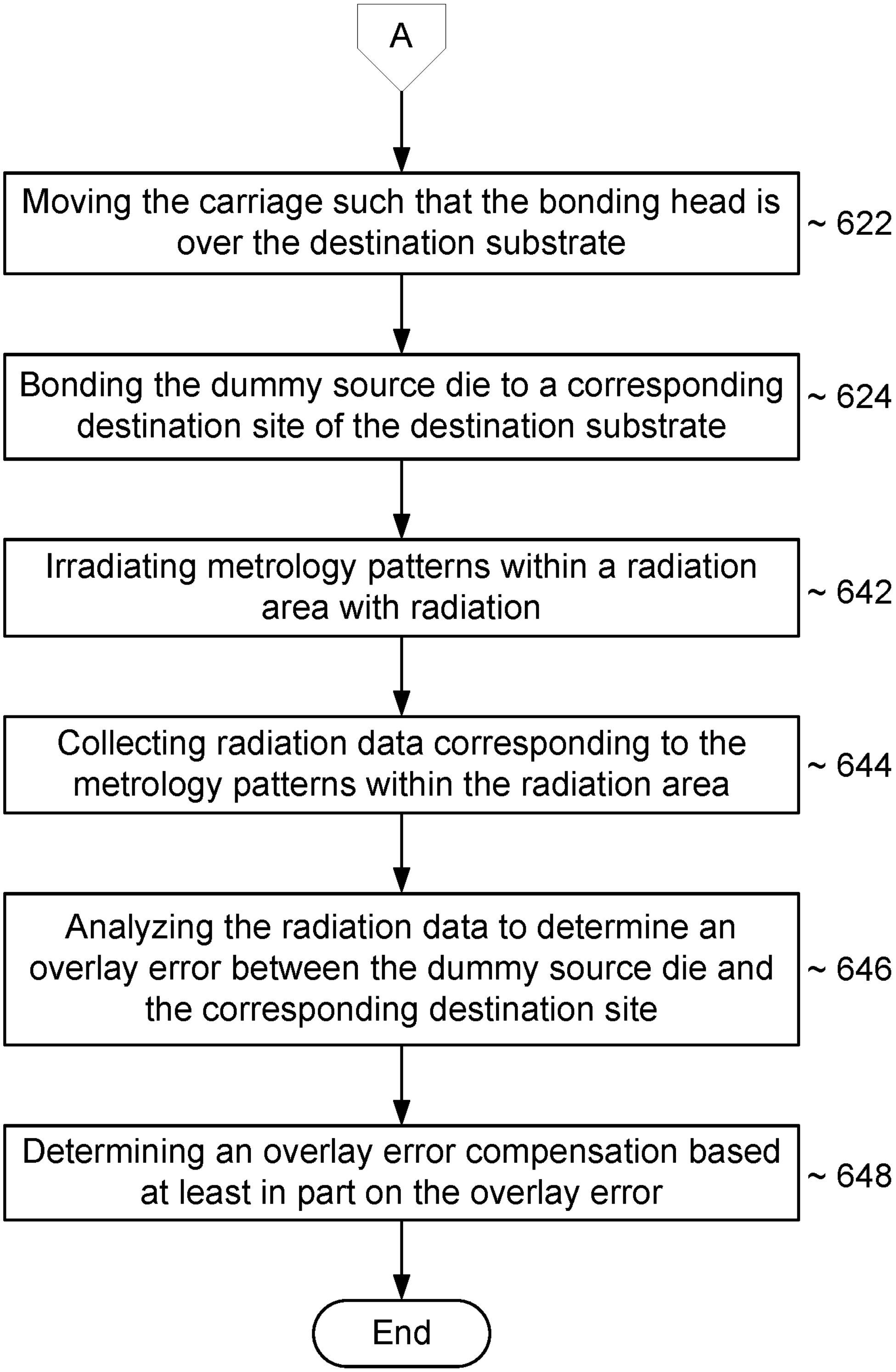

Attention is directed to methods of using the system 100. FIGS. 5 and 6 includes a process flow diagram for a method that is described with respect to FIGS. 7 to 26, and FIGS. 27 and 28 includes a process flow diagram of a method that is described with respect to FIGS. 29 to 37. In practice, FIGS. 5 and 6 can be used to determine an overlay error, and FIGS. 27 and 28 include a method of bonding source dies to destination sites including adjusting a position of a source die, a destination site, or both to compensate for the overlay error as described with respect to FIGS. 5 and 6. Some portions of the system 100 illustrated in FIGS. 1 to 4, such as the controller 160 and the memory 162 are not illustrated in FIGS. 7 to 26 and 29 to 38 to simplify understanding of the concepts described herein.

Figure 7:
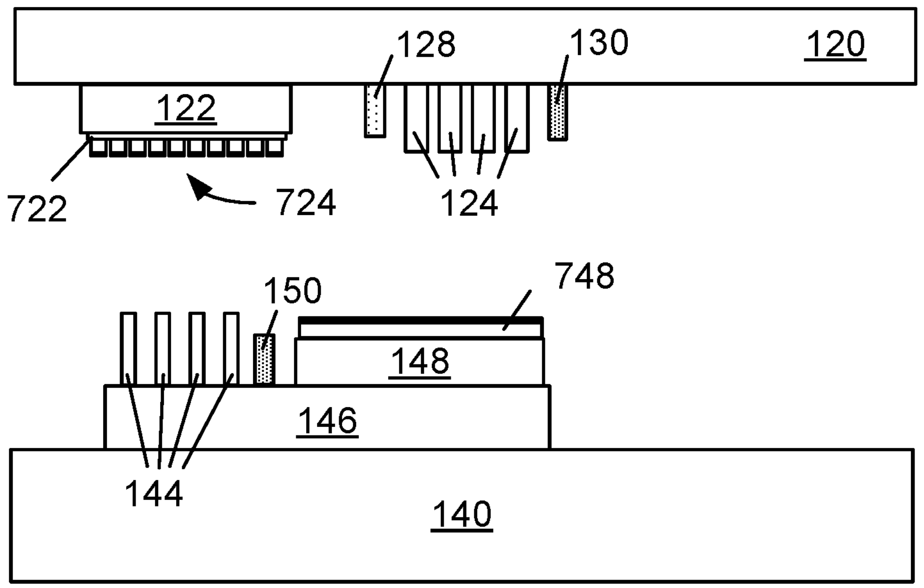
FIG. 7 includes an illustration of a cross-sectional view of a portion of the apparatus after loading a source substrate over a source substrate chuck and a destination substrate over a destination substrate chuck.

The method can include mounting a destination substrate onto a destination substrate chuck at block 522 and mounting a source substrate onto a source substrate chuck at block 524 and in FIG. 5. Referring to FIG. 7, the carriage 146 may be moved to allow easier access to the source substrate chuck 122 and destination substrate chuck 148. The actions in blocks 522 and 524 can be performed in either order. Furthermore, mounting the source substrate can be performed as late as after collecting radiation data in block 644 in FIG. 6. After reading this specification in its entirety, skilled artisans will be able to determine when mounting the source substrate is to be performed for the needs or desires for a particular application.

Referring to FIG. 7, a destination substrate 748 is mounted over the destination substrate chuck 148. The destination substrate 748 can include a semiconductor wafer, a package substrate, a printed wiring board, a circuit board, an interposer, or the like. Microelectronic devices may be part of the destination substrate 748, such as a semiconductor wafer. The package substrate, the printed wiring board, the circuit board, or the interposer may or may not have dies mounted thereto. Part or all of the side of the destination substrate 748 can be activated for hybrid bonding. In an implementation, an activated surface for hybrid bonding is illustrated as a dark band along the exposed surface of the destination substrate 748.

Figure 8:
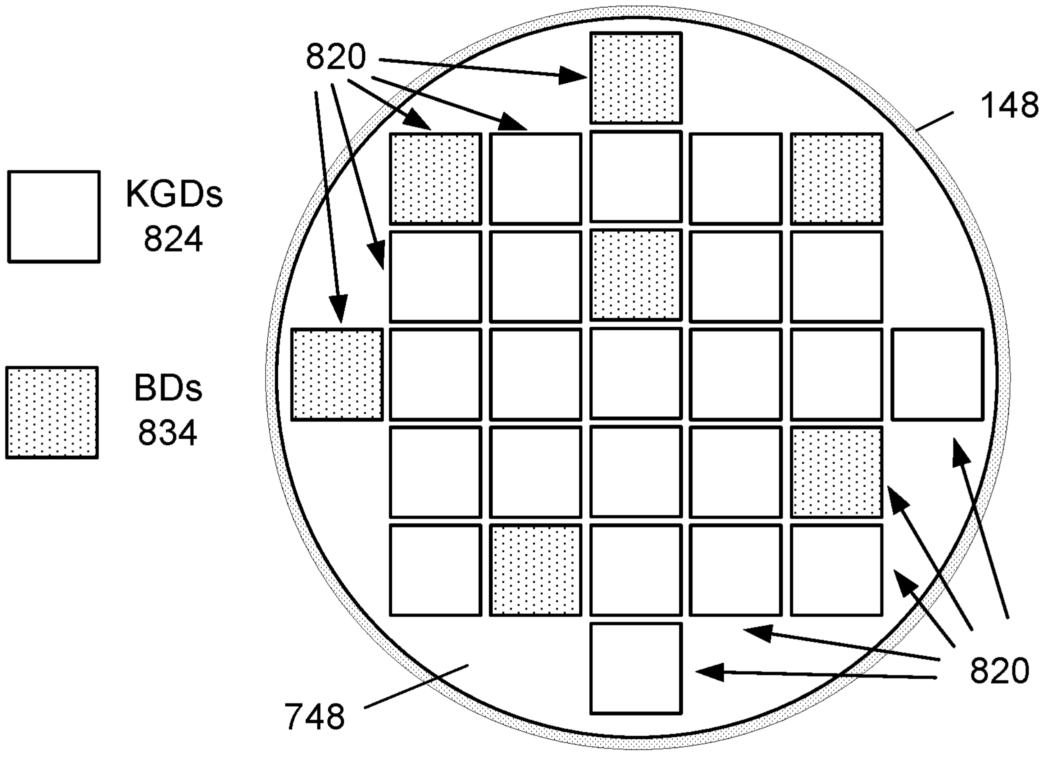
FIG. 8 includes a top view of a destination substrate chuck and the destination substrate, wherein the destination substrate includes known good dies and bad dies.

FIG. 8 includes a top view of the destination substrate chuck 148 and the destination substrate 748. The destination substrate 748 includes destination dies 820. Any or all destination dies 820 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, a die bonding location of the destination substrate, or the like.

Each of the destination dies 820 can be a known good die (KGD) 824 or a bad die 834. A KGD, whether a destination die, a source die, or another die, passed one or more tests and is acceptable for bonding to another die. A bad die failed at least one test, where the test can be for electrical opens, electrical shorts, other functional testing (e.g., a process operation may not have been performed (missing an implant, an insulating layer was not formed, an etch operation was missed, or the like), the process operation may have been inadvertently performed more than one time, or the like), or the die operates too slowly (e.g., operating frequency is too low, read access time is too long, or the like)) for a particular application.

Referring to FIGS. 1 to 4 and 8, the information regarding the KGDs 824 and bad dies 834 and their locations with respect to the destination substrate 748 can be stored in the memory 162 or another data storage unit (e.g., a hard disk, a database, or the like) external to the system 100 for later use when determining where source dies are to be bonded to the destination substrate 748. In an implementation, all of the destination dies 820, whether KGDs 824 or bad dies 834, can have the electrical circuit elements and electrical circuits including pluralities of electrical circuit elements. As used herein, an electrical circuit element can include a transistor, a capacitor, a resistor, or an inductor and does not include a conductive structure (such as a contact pad, an interconnect, or a conductive plug between different levels of interconnects) by itself.

Referring to FIG. 7, a source substrate 722 can be mounted along the source substrate chuck 122. A plurality of dies 724 can be attached to the source substrate 722. The plurality of dies 724 can include a plurality of production source dies. As used herein, a production source die is a die that is formed during a microelectronic fabrication process and includes an electrical circuit element. The production source die may include a single electrical circuit element or may include an electrical circuit that includes a plurality of electrical circuit elements. A production source die may be a KGD or a bad die. All or only some, not all, of the plurality of the dies 724 are to be transferred to the destination substrate 748. The source substrate 722 can be an adhesive tape that may be in the form of a tape frame or tape reel, a container having a lattice that defines a matrix of regions that can hold the plurality of dies 724, or the like.

Each die within the plurality of dies 724 may include a plurality of contact pads (such as contact structures or a conductive interconnect). The plurality of contacts may be arranged on a rectangular, square, oblique, or hexagonal lattice, in which each lattice point in a region of the die includes a contact pad. The bonding sites of the destination substrate 748 will have an identical set of contact pads to match the contact pads on the plurality of dies 724. The arrangement of the contact pads on each die may have a spatial frequency that is characterized by its periodicity in two directions and also the relative phases of the periodic arrangement in two directions. The phases may be relative to a fixed point on the die such as a corner of the die.

Any or all dies within the plurality of dies 724 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, or the like. All dies within the plurality of dies 724 can include identical circuit element(s) and, if any circuit is present, identical circuit(s).

The die has a device side, which has most or all of the electrical circuit elements of the die, and a back side opposite the device side. In the implementation as illustrated in FIG. 7, the back sides of the dies within the plurality of dies 724 are disposed between the source substrate chuck 122 and the device sides of the dies. In another implementation, the device sides of the dies within the plurality of dies 724 are disposed between the source substrate chuck 122 and the back sides of the dies. The sides of the dies facing the base 140 or a component coupled to the base 140 are activated for hybrid bonding to the destination substrate 748, and the dark bands along the bottom of the dies within the plurality of dies 724 are used to illustrate the activated surface. Any one or more of the dies can have a TSV or an electrical component along the back side, and such die(s) may also include back side bonding sites that may act as future destination substrate bonding sites that may be used at a later time.

Figure 9:
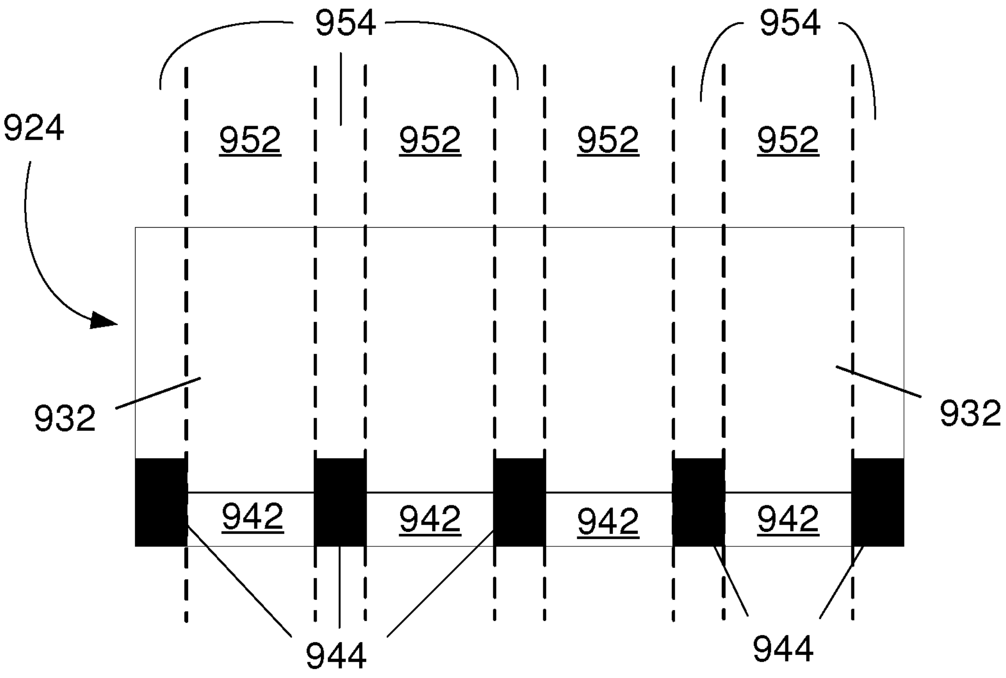
FIG. 9 includes a cross-sectional view of a portion of a dummy source die.

Before continuing with the method, a portion of a dummy source die 924 is described. FIG. 9 includes a cross sectional view of the portion of the dummy source die 924. The dummy source die 924 can be used in determining an overlay error between the dummy source die and a corresponding destination site of the destination substrate 748. As used herein, a dummy die, such as the dummy source die 924, does not have any electrical circuit element that is or will be electrically connected to an electrical circuit element within a KGD of the destination substrate. The dummy source die 924 includes a substrate 932, an insulating layer 942, and alignment marks 944. In an implementation, the alignment marks 944 can be an array of dummy contact pads. Radiation can be used during a later radiation analysis operation. With respect to any particular layer, feature (such as an alignment mark, an interconnect, a conductive plug, etc.) or material, radiation can be transmitted through, absorbed by, or reflected by such layer, feature, or material. As used herein, "non-transmissive" and its variants refer to radiation that is absorbed, reflected, or a combination of absorbed and reflected by such layer, feature, or material. The substrate 932 and the insulating layer 942 are relatively transmissive to radiation as compared to the alignment marks 944, and the alignment marks 944 are relatively non-transmissive with respect to the radiation as compared to the substrate 932 and the insulating layer 942. More details regarding metrology patterns is described in more detail later in this specification.

The substrate 932 can include a semiconductor base material (e.g., Si, SiC, a III-V semiconductor material, a II-VI semiconductor material, or the like) and may or may not include an insulating layer, a patterned polysilicon layer, or the like overlying the semiconductor base material. In an implementation, the semiconductor material can include Si, 4H-SiC, 6H-SiC, $Al_xGa_{(1-x)}N$ where $0 \leq x \leq 1$, or a combination of layers, wherein each layer within combination of layers includes one of the semiconductor materials. The insulating layer 942 can include one or more films of a silicon oxide, a silicon nitride, or a silicon oxynitride. The alignment marks 944 can include a metal or metal alloy, such as Al, Al–1 wt % Cu, Cu, Ag, Au, Pt, Co, W, TiW, Ti, Ta, or the like. More layers may be used for the dummy source die 924.

Zones 954 correspond to the alignment marks 944, and the zones 952 correspond to regions between the alignment marks 944. The zones 952 and 954 extend through, above, and below the alignment marks 944. Any object or portion of the dummy source die 924 that is within a particular zone 954 and outside its corresponding alignment mark 944 is directly above or directly below the corresponding alignment mark 944, regardless whether or not such object or portion thereof contacts or is spaced apart from the corresponding alignment mark 944. For example, referring to FIG. 9, a portion of the substrate 932 along the side opposite the alignment marks 944 and within a particular zone 954 is directly above the corresponding alignment mark 944 within the particular zone 954. Such portion does not directly overlie portions of the insulating layer 942 within the immediately adjacent zones 952 or a different alignment mark in a different zone 954.

The method can further include moving a carriage to a dummy source die loading position at block 526 and placing a dummy source die on a die transfer seat at block 528 in FIG. 5. Placing the dummy source die 924 may include one of the die transfer seats removing the dummy source die 924 from the source substrate 722 on the source substrate chuck 122. In an alternative implementation, the die loading machine 180 loads the dummy source die 924 directly onto the transfer seat 144 and is described below with respect to FIG. 10.

Figure 10:
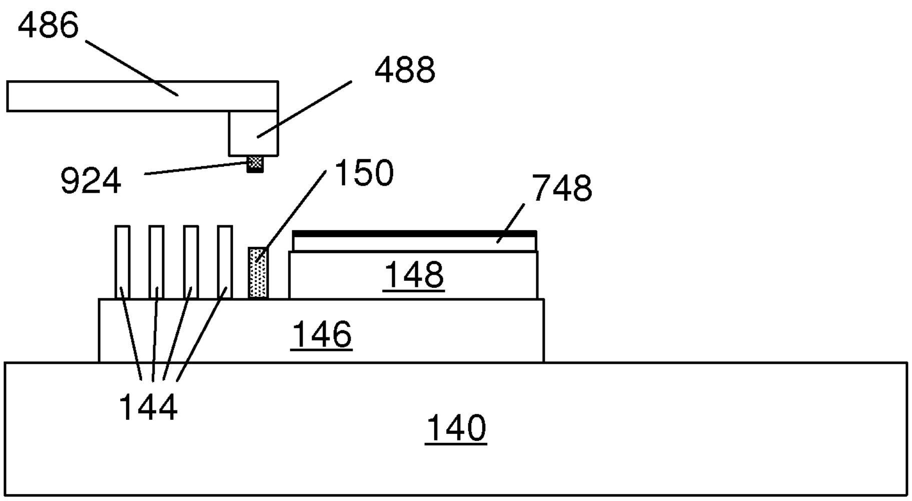
FIG. 10 includes an illustration of a cross-sectional view of a portion of the system of FIG. 1 while a dummy source die is held by the die loading machine.
Figure 11:
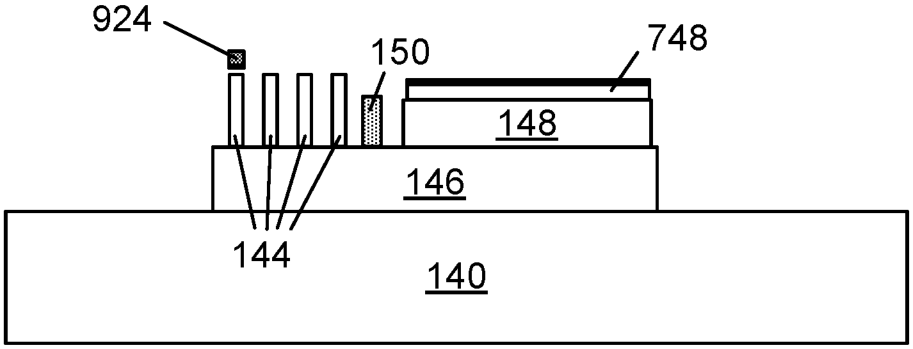
FIG. 11 includes an illustration of a cross-sectional view of a base of the system of FIG. 10 after transferring the dummy source die to a die transfer seat.

Referring to FIGS. 1 to 4, and 10, the dummy source die 924 can be held by the die transfer head 488 that is coupled to the positioning arm 486 of the die loading machine 180. The controller 160 or a local controller can transmit a signal for the carriage 146, the die loading machine 180 or both to move so that the dummy source die 924 overlies the optical component 150. The optical component 150 can be used to ensure the dummy source die 924 is a correct die to be subsequently bonded to the destination substrate 748. The optical component 150 may also be used to confirm that the positioning of the dummy source die 924 is proper to allow for transfer to a die transfer seat within the array of die transfer seats 144. Referring to FIGS. 10 and 11, a die chuck of a die transfer seat within the array of die transfer seats 144 can be extended toward the die transfer head 488, retrieve the dummy source die 924 from the die transfer head 488, and retract the die chuck away from the die transfer head 488.

In an implementation, the die chucks of the array of die transfer seats 144 do not contact the activated surfaces of the dies, such as the dummy source die 924. The dummy source die is drawn in FIG. 11 as being spaced apart from the die transfer seat within array of die transfer seats 144 to illustrate that the activated surfaces of the dummy source die does not contact the die transfer seat within the plurality of die transfer seats. The array of die transfer seats 144 can have a design that allows dies to be picked up along lateral side surfaces of the dies, where the side surfaces are between the device and back sides of the dies.

If the dummy source die 924 die is too thin to be held by its sides, a backing plate (not illustrated) can be coupled to the die. For example, a die may have a thickness less than 50 μm. A thickness of the backing plate or a combined thickness of the backing plate and die is sufficient to allow a pick-up head to pick up the backing plate or a combination of the backing plate and die without having an activated surface of the die contacting the pick-up head. The backing plate can have a thickness in a range from 100 μm to 500 μm.

The backing plate can be coupled to the dummy source die 924 using an adhesive compound. The backing plate may be removed at a later time or remain coupled to the die in the finished electrical device. After the die is bonded to the destination substrate 748, the backing plate may be removed. In an implementation, the adhesive compound may be deactivated by exposure to actinic radiation. The actinic radiation may be in a range from 100 nm to 1000 nm. In such an implementation, at least 70% of the actinic radiation to be transmitted through the backing plate. In another implementation, a solvent can be used to remove the adhesive compound from between the dummy source die and the backing plate.

In a further implementation, the die chucks for the array of die transfer seats 144 can have a design where the die chucks contact the bottom-facing surface of the dummy source die 924. After reading this specification in its entirety, skilled artisans will be able to determine whether the array of die transfer seats 144 should or should not contact the dummy source die 924 for a particular application.

In another implementation, the dummy source die 924 and production source dies within the plurality of dies 724 can be attached to the source substrate 722. The dummy source die 924 can be picked up from the source substrate 722. The method of picking up die from the source substrate 722 is described in more detail with the process flow diagram in FIGS. 27 and 28.

Figure 12:
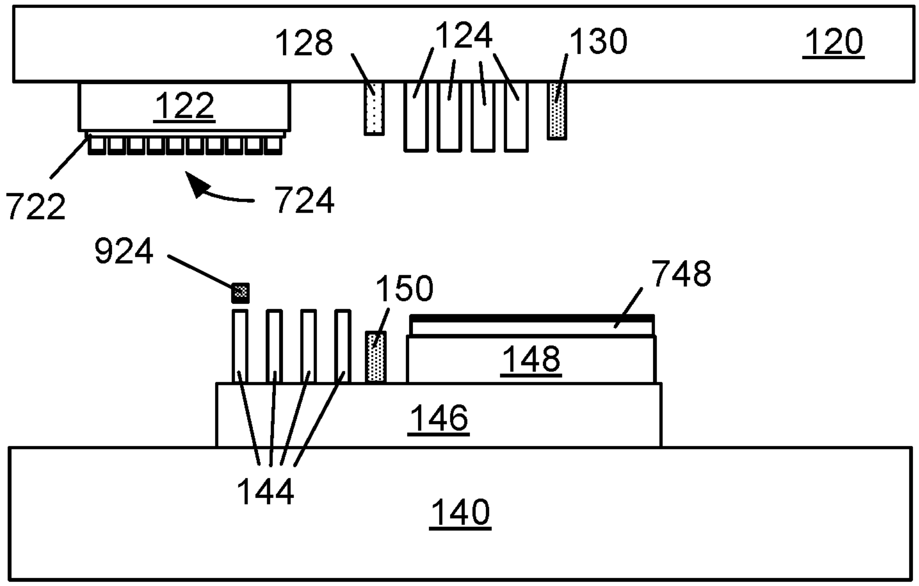
FIG. 12 includes an illustration of a cross-sectional view of the system of FIG. 11 when positioning the carriage using an optical component under an alignment reference coupled to the bridge.
Figure 13:
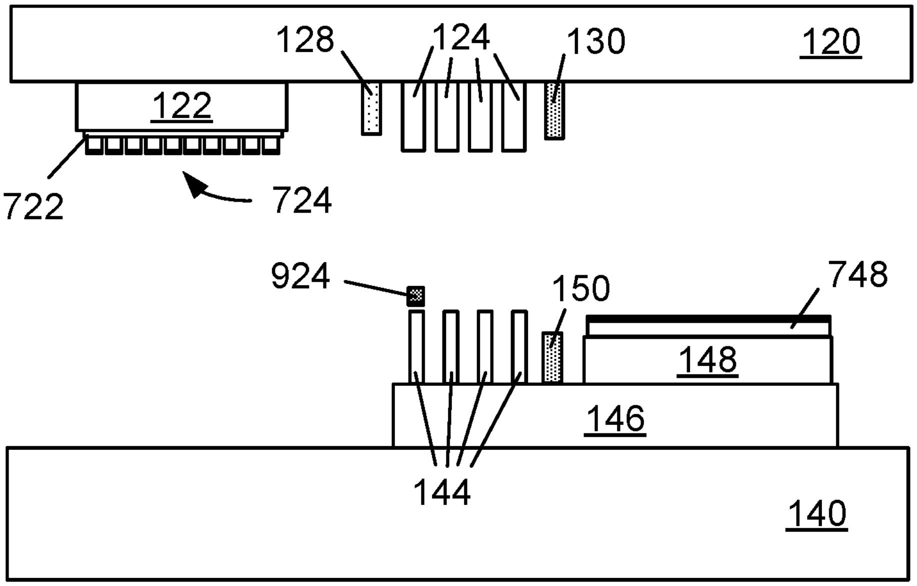
FIG. 13 includes an illustration of a cross-sectional view of the system of FIG. 12 after positioning the dummy source die under a bonding head.

The method can further include transferring the dummy source die from the die transfer seat to a bonding head at block 542 in FIG. 5. The carriage 146 is moved so that the alignment reference 128 is over the optical component 150 as illustrated in FIG. 12. Information collected from the optical component 150 can be received by the controller 160 or a local controller. The controller 160 or a local controller can use the information and send a signal for the carriage 146 to move to a desired location. In an implementation and as illustrated in FIG. 13, the carriage 146 is moved so that a bonding head within the array of bonding heads 124 is over the dummy source die 924. The movement can include moving the carriage in an X-direction, a Y-direction, rotating the carriage along an X-Y plane, or a combination thereof.

Figure 14:
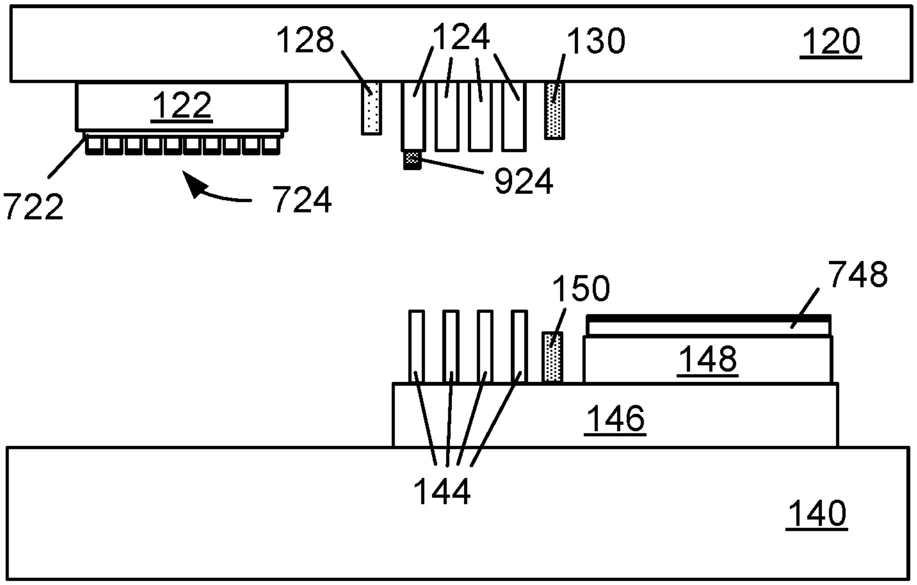
FIG. 14 includes an illustration of a cross-sectional view of the system of FIG. 13 after transferring the dummy source die from the die transfer seat to the bonding head.

The die chuck for the die transfer seat within the array of die transfer seats 144 that is holding the dummy source die 924 can be extended toward a bonding head within the array of bonding heads 124, the die chuck for the bonding head can be extended toward the die transfer seat that holds the dummy source die, or both. FIG. 14 includes the dummy source die 924 after transferring the dummy source die 924 from the die transfer seat to the bonding head.

Figure 15:
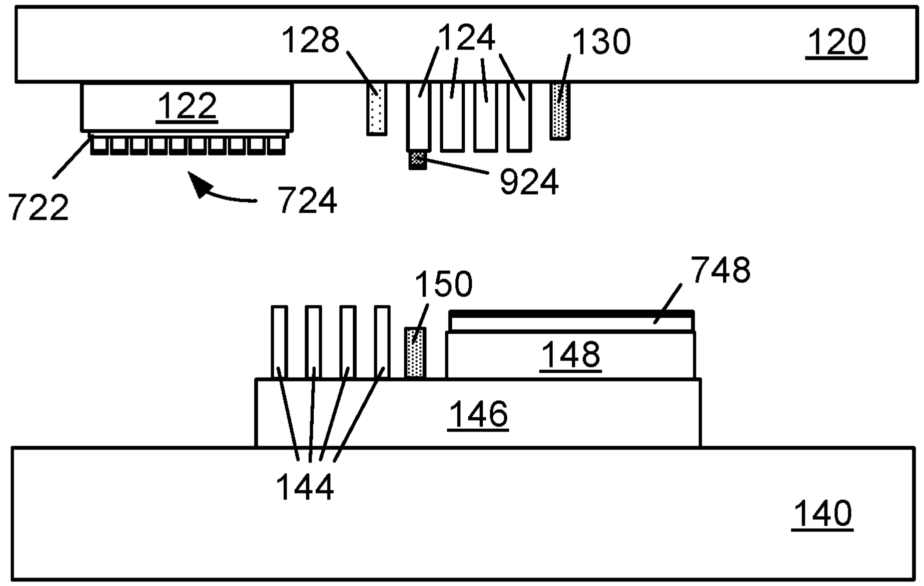
FIG. 15 includes an illustration of a cross-sectional view of the system of FIG. 14 when measuring alignment error for the dummy source die.

The method can include measuring alignment of the dummy source die using an optical component at block 544 in FIG. 5. Referring to FIG. 15, the optical component 150 coupled to the carriage 146 may be used in positioning the dummy source die 924, measuring alignment error of the dummy source die 924, or both. Better positioning of the dummy source die 924 can be accomplished by measuring an alignment error as a position of the dummy source die 924 on the bonding head relative to an ideal position of the dummy source die 924 on the bonding head. Information from the optical component 150 can be sent to and received by the controller 160 or a local controller.

The controller 160 or a local controller can use the information to determine an alignment error and an amount of positioning of the dummy source die 924 so that the dummy source die 924 will be more closely aligned to its corresponding destination site of the destination substrate 748. The controller 160 or a local controller can transmit a signal, so that the position of the dummy source die 924 is adjusted by moving the die chuck of the bonding head using the limited range of motion of the die chuck relative to its corresponding body. Thus, in an implementation, moving the die chuck allows the position of the dummy source die 924 to be adjusted relative to the destination substrate 748 that is held by the destination substrate chuck 148. Positioning and measuring alignment error may be performed iteratively until the alignment error is zero or an acceptably low value.

Figure 16:
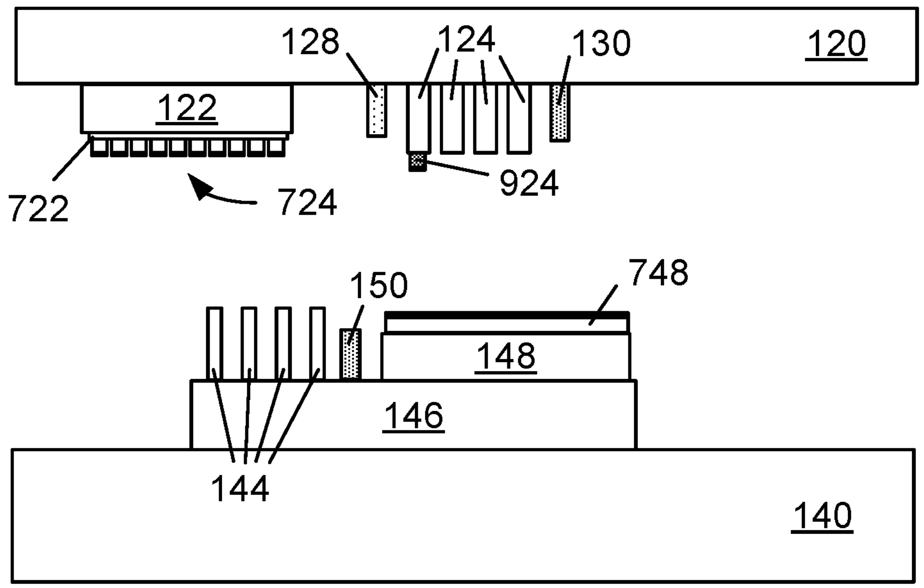
FIG. 16 includes an illustration of a cross-sectional view of the system of FIG. 15 after positioning the dummy source die over the destination substrate.

The method can include moving the carriage such that the bonding head is over the destination substrate at block 622 in FIG. 6. In FIG. 16, the carriage 146 is moved so that the dummy source die is over its corresponding destination site for the destination substrate 748.

Figure 17:
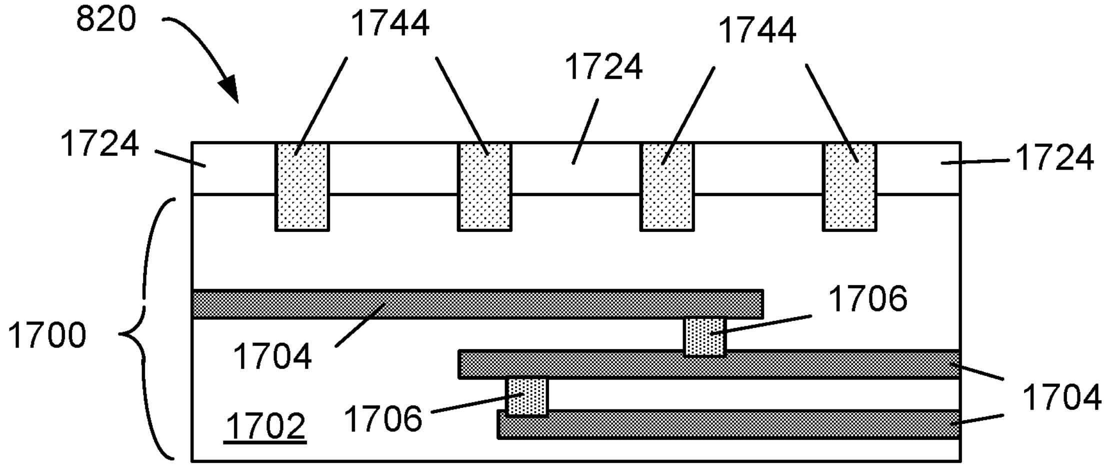
FIG. 17 includes a cross-sectional view of a portion of a destination die that includes alignment marks.
Figure 18:
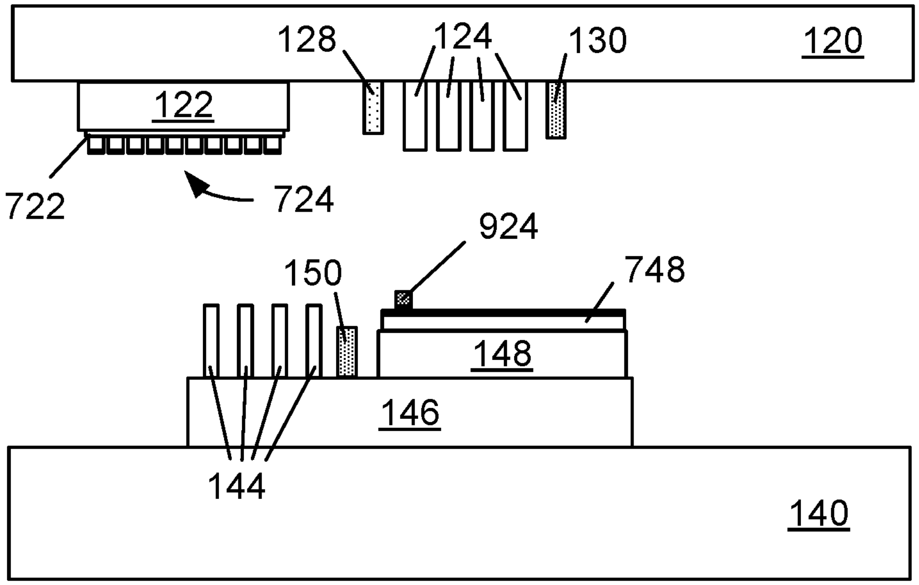
FIG. 18 includes an illustration of a cross-sectional view of the system of FIG. 16 after bonding the dummy source die to a destination site of the destination substrate.

Before continuing with the method, an exemplary construction for part of a destination site is described with respect to FIG. 17. FIG. 17 includes a cross-sectional view of a portion of one of the destination dies 820. The KGDs 824 and the bad dies 834 can have the construction as illustrated in FIG. 17 including a portion of a metrology pattern that includes alignment marks 1744 that extend through a silicon oxide layer 1724 and into a substrate 1700. The alignment marks 1744 can be an array of contact pads. A contact pad electrically connected to an electrical circuit element is referred to herein as an active contact pad. The array of contact pads can be dummy contact pads or active contact pads. The metrology pattern is addressed in more detail later in this specification with respect to FIG. 24. FIG. 17 includes only a portion of a substrate 1700 that can include a semiconductor base material (not illustrated), electronic components (not illustrated), an insulating layer 1702, interconnects 1704, and conductive plugs 1706.

The insulating layer 1702 can include a plurality of insulating layers each including an oxide, a nitride, or an oxynitride. The interconnects 1704 can be made of a metal or metal alloy, such as Al, Al-1 wt % Cu, Cu, Ag, Au, Pt, Co, W, TiW, Ti, Ta, or the like. The conductive plugs 1706 can include any of the materials described with respect to the interconnects 1704. The silicon oxide layer 1724 can include a silicon oxide, a silicon nitride, or a silicon oxynitride. The alignment marks 1744 can include any of the materials as described with respect to the interconnects 1704. The alignment marks 1744 and the interconnects 1704 can have the same material or different materials.

Referring to FIG. 17, features other than insulating layers can underlie at least a portion the metrology pattern. The interconnects 1704 and the conductive plugs 1706 underlie the metrology pattern. Portions of the interconnects 1704 and the conductive plugs 1706 directly underlie the alignment marks 1744 of the metrology pattern. The terms "directly underlie" and "directly overlie" have been previously addressed with respect to FIG. 9. In another implementation, more, fewer, or no features other than the insulating layer 1702 may directly underlie the metrology pattern or alignment marks within the metrology pattern.

The method can further include bonding the dummy source die to a corresponding destination site of the destination substrate at block 624 in FIG. 6. The die chuck for the bonding head within the array of bonding heads 124 can be extended toward the destination substrate 748, the destination substrate chuck 148 can be extended toward the array of bonding heads 124, or both. Pressure is exerted to bond the dummy source die 924 to its corresponding destination site of the destination substrate 748 in FIG. 18. In an implementation, the bonds can be oxide-to-oxide bonds. The pressure during bonding can be in a range 0.5 $N/cm^2$ to 20 $N/cm^2$. The bonding can be performed at room temperature (for example, at a temperature in a range from 20° C. to 25° C.) or higher. Bonding is performed at a temperature less than a subsequent anneal to expand conductive metal within the dies and at the destination sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

Figure 19:
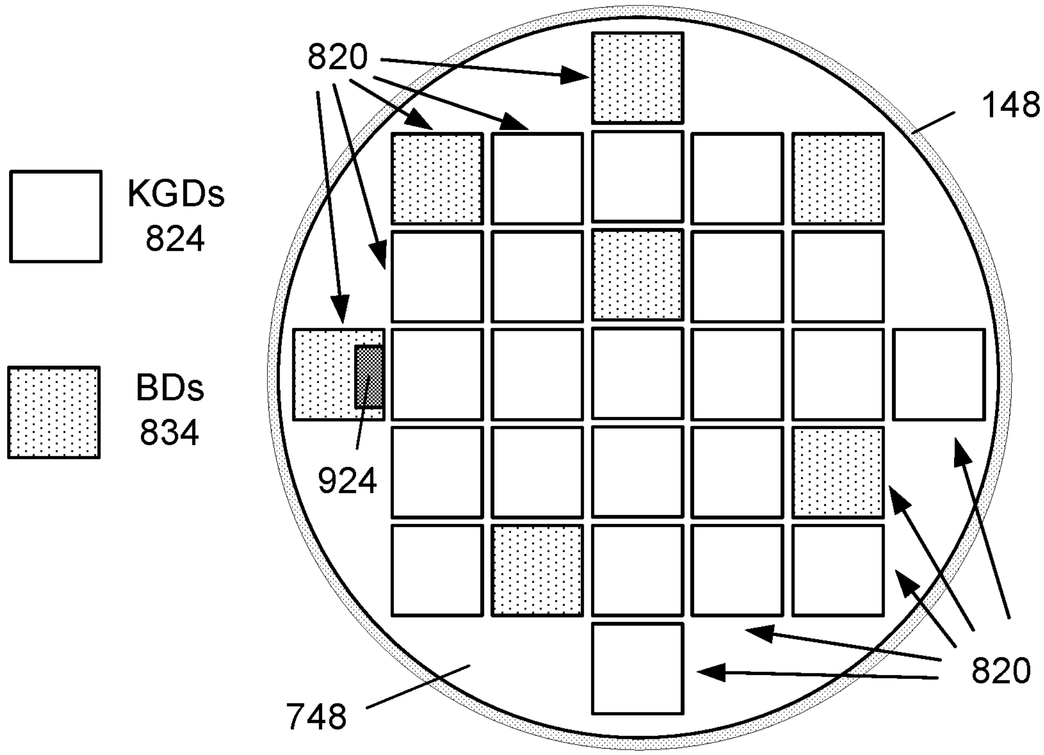
FIG. 19 includes an illustration of a top view of the destination substrate chuck and the destination substrate of the system of FIG. 18 after bonding the dummy source die to the destination site.

FIG. 19 includes a top view of the destination substrate 148 and the destination substrate 748 after the dummy source die 924 is bonded to its corresponding destination site of the destination substrate 748. To maintain high yield for the destination substrate 748, the dummy source die 924 can be bonded to a bad die 834 of the destination substrate 748.

Figure 20:
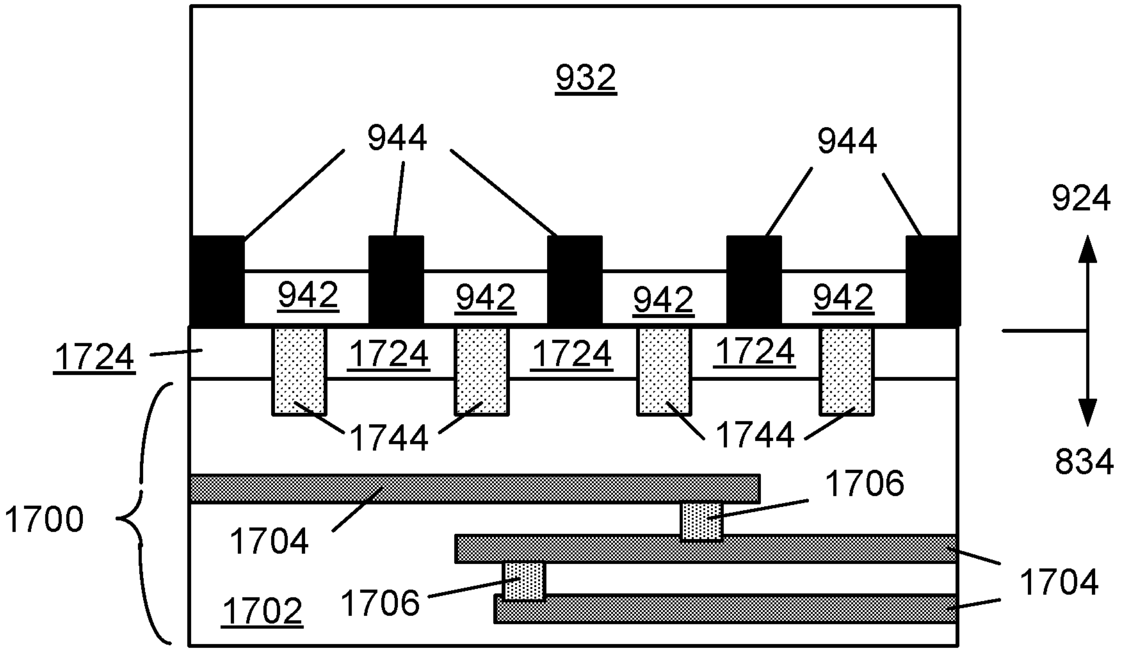
FIG. 20 includes a cross-sectional view of portions of the dummy source die and the destination die at metrology patterns of the dies.

FIG. 20 includes a cross-sectional view of portions of the dummy source die 924 and the bad die 834 at metrology patterns of the dies. Alignment marks 944 for the dummy source die 924 can be at the bonding surface and contact the bad die 834, and alignment marks 1744 for the bad die 834 can be at the bonding surface and contact the dummy source die 924. The alignment marks do not need to be at the bonding surfaces. For example, the alignment marks 944 in the dummy source die 924 can be spaced apart from the bonding surface by at least part of the insulating layer 942, so that the alignment marks 944 do not contact the bad die 834. Similarly, the alignment marks 1744 of the bad die 834 can be spaced apart from the bonding surface by at least part of the silicon oxide layer 1724, so that the alignment marks 1744 and not contact the dummy source die 924.

Figure 21:
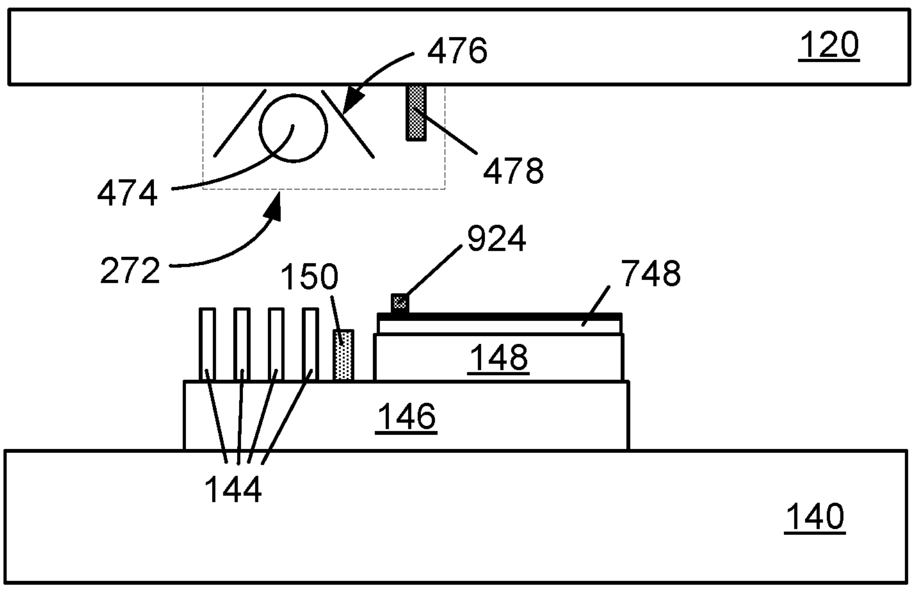
FIG. 21 includes an illustration of a cross-sectional view of the system of FIG. 19 when collecting radiation data related to the dummy source die and the destination site.

The method can include irradiating metrology patterns within a radiation area with radiation at block 642 and collecting radiation data corresponding to the metrology patterns within the radiation area at block 644 in FIG. 6. FIG. 21 includes a cross-sectional view at this point in the method. The radiation tool 272 includes a radiation source 474, a reflector 476 that can be in a form of a truncated cone or another shape, and a radiation detector 478. The reflector 476 is optional and may or may not be present.

Radiation emitted by the radiation source 474 can be reflected by some components within metrology patterns within the dummy source die 924 and the destination site of the destination substrate 748. The reflected radiation can be received by the radiation detector 478. In the same or different implementation, the radiation source 474 may be absorbed and cause some components within the dummy source die 924 or the destination site of the destination substrate 748 to fluoresce, phosphoresce, or produce ionized radiation, and the radiation detector 478 can detect the fluorescence, the phosphorescence, or the ionized radiation emitted by such components. Thus, the radiation detector 478 may detect the same or a different form of radiation as emitted by the radiation source 474. For the purposes of this specification, a component within the dummy source die 924 or the destination site of the destination substrate 748 that fluoresces, phosphoresces, or produces ionized radiation in response to being irradiated by the radiation is a type of non-transmissive component.

In another implementation, radiation can be transmitted through the dummy source die 924 and the destination substrate 748 may be detected by a radiation detector within the destination substrate chuck 148, the carriage 146, the base 140, or another suitable portion of the system 100. Similar to the radiation detector 478, the radiation detector for the transmitted radiation may detect the same type of radiation emitted by radiation source 474 or another form of radiation, such as fluorescence, phosphorescence, or ionized radiation.

The radiation can be selected so that the dummy source die 924 includes relatively non-transmissive portions and relatively transmissive portions. As previously described, the alignment marks 944 can include a metal or metal alloy that transmits absorbs, reflects, or absorbs and reflects the radiation more than the insulating layer 942 and the substrate 932, where the substrate 932 can include a semiconductor material, an insulating layer, or a combination thereof. The non-transmissive portions can be the alignment marks 944, and the relatively transmissive portions can include the insulating layer 942 and the substrate 932. In an implementation, the radiation can be infrared radiation (IR) and have a wavelength in a range from 0.7 μm to 1000 μm and, in a particular implementation, from 1 μm to 10 μm or from 1 μm to 2 μm.

The radiation detector 478, the radiation detector within the destination substrate chuck 148, the carriage 146, the base 140, or another suitable portion of the system 100, or another component coupled to the radiation tool 272 can collect at least some radiation data. The radiation data can include the measurements of intensities of radiation detected and locations where such intensities were detected. If the radiation detector 478 does not collect location information, such location information may be obtained from the carriage 146 or another suitable component within the system 100.

Figure 22:
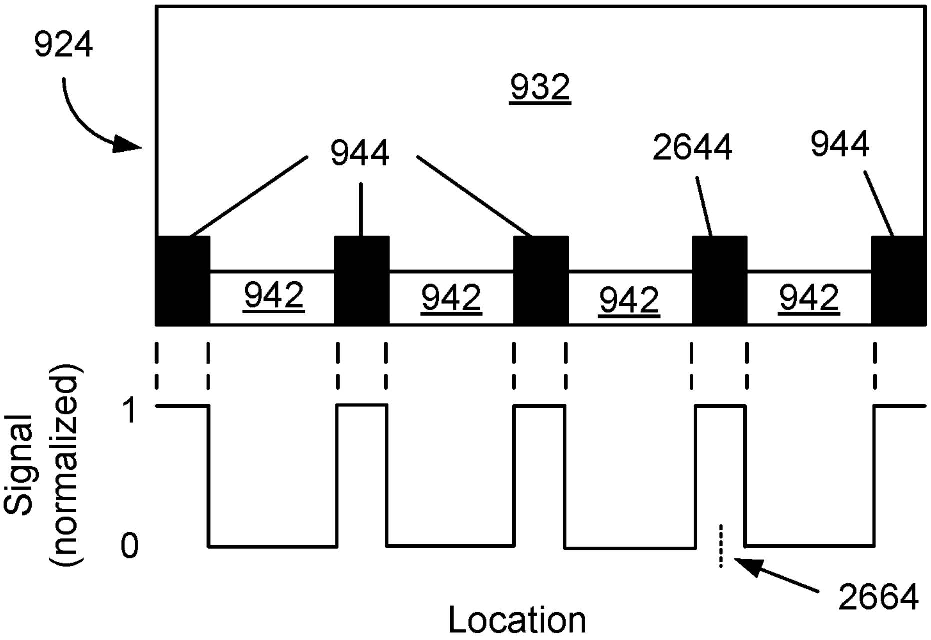
FIG. 22 includes an illustration of a portion of the dummy source substrate within a radiation area and radiation data corresponding to the portion of the dummy source die.

FIG. 22 includes exemplary radiation data and location information that can be collected relative to the dummy source die 924. Referring to FIGS. 21 and 22, the detected signal from the radiation detector 478 is normalized using only the locations with the alignment marks 944 and 2644 and locations between the alignment marks 944. The alignment mark 2644 is a particular alignment mark and is one of the alignment marks 944. Most of the radiation from the radiation source 474 may be reflected by the alignment marks 944 and has a value of 1 in FIG. 22, and substantially less radiation is reflected within locations between the alignment marks and has a value of 0 in FIG. 22. In practice, not all radiation is reflected by the alignment marks 944 and at least some radiation may be reflected by the combination of the substrate 932 and the insulating layer 942.

Figure 23:
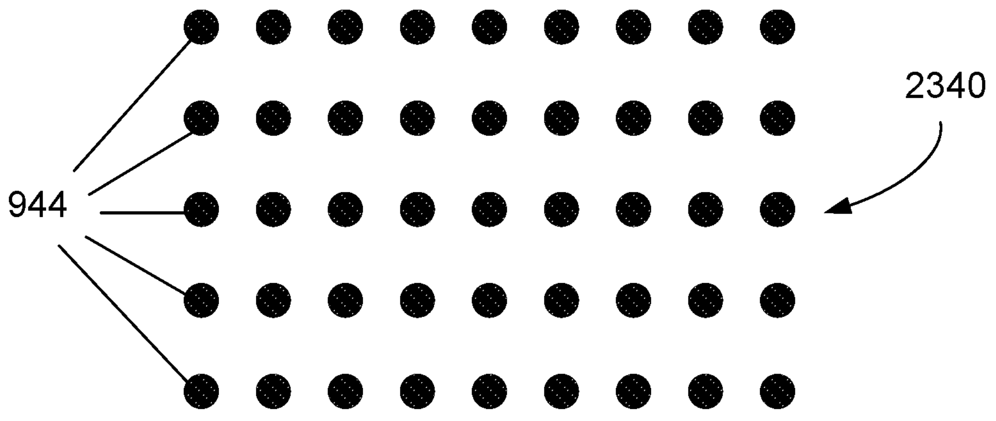
FIG. 23 includes an illustration of a metrology pattern of the dummy source die.
Figure 24:
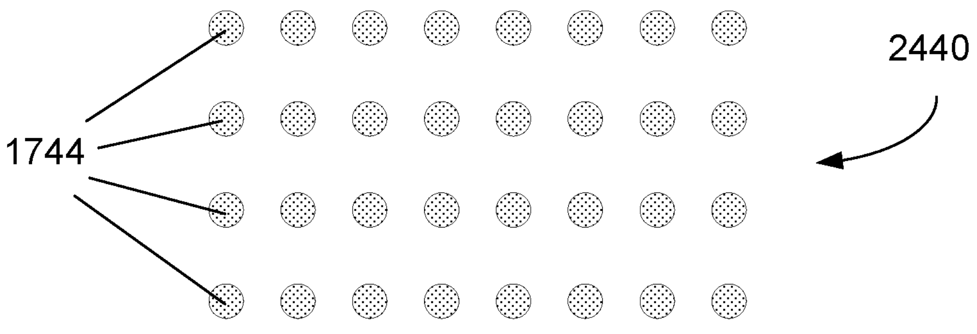
FIG. 24 includes an illustration of a metrology pattern of the destination die.

Metrology patterns are described with respect to FIGS. 23 and 24. After reading this specification in its entirety, skilled artisans will understand that the metrology patterns illustrated in FIGS. 23 and 24 are exemplary and do not limit the shape or size of features and spacings between the features for other metrology patterns. FIG. 23 includes a top view of a metrology pattern 2340 of the dummy source die 924. The metrology pattern 2340 can include alignment marks used in helping to determine overlay error. In the implementation as illustrated in FIG. 23, the alignment marks are an array of dummy contact pads. As used herein, dummy contact pads of a die are contact pads that are not electrically connected to an electrical circuit element or an electrical circuit within the die. In the same or another implementation, the metrology pattern 2340 may be along the bonding surface of the dummy source die 924 or may be spaced apart from and not lie along the bonding surface. The dummy source die 924 has substantially the same (within 1%) dimensions and mass as one of the plurality of dies 724. The dummy source die 924 has dummy contact pads that are arranged in the same pattern as the dummy contact pads on the plurality of dies 724, with exception of the phase which is offset relative to the phase on one of the plurality of dies 724. While each of the plurality of dies 724 may include multiple layers of patterned features within the die, the dummy source die 924 may include only unpatterned layers, or no interior layers but does include the patterned contact pads.

FIG. 24 includes a top view a metrology pattern 2440 of the destination site. The metrology pattern 2440 can be a dedicated metrology structure that is not electrically connected to any electrical circuit element or electrical circuit within the destination site. In this implementation, the metrology pattern 2440 can include alignment marks that are an array of dummy contact pads. In another implementation, the metrology pattern 2440 can correspond to a portion of the destination site having closely packed contact pads electrically coupled to electrical circuit elements and not be designed to be part of dedicated alignment marks. Referring to FIG. 8, such active contact pads may be part of a bad die 834 of the destination substrate 748. The metrology pattern 2340 of the source die 924 can have a pattern corresponding to the closely packed active contact pads of a destination die. In an implementation, the destination site of the dummy source die 924 is identical to the destination sites of the plurality of dies 724.

In any of the foregoing implementations, the metrology pattern 2440 may be an array of contact pads (dummy or active) that lie along the bonding surface of the destination die or may be an array of metal or metal alloy features that are formed at a lower elevation within the destination site. A destination die can include a lowest level of interconnects that may include gate electrodes and word lines, another level that includes bit lines and interconnects that are electrically connected to source regions, drain regions, gate electrodes, or a combination thereof, still another level interconnects, a further level of interconnects, and finally a level including contact pads. Due to electromagnetic radiation, parasitic coupling, or the like, the alignment marks 1744 within the destination site may be formed with a lower level of interconnects as opposed to the contact pad level. Thus, the metrology pattern 2440 may be spaced apart from and not lie along the bonding surface.

Referring to FIGS. 9 and 23, portions of the dummy source die 924 within the zones 952 are relatively transmissive portions, and portions of the dummy source die 924 within the zones 954 are relatively non-transmissive portions due to the presence of the alignment marks 944. Within the metrology pattern 2340, alignment marks 944 correspond to the relatively non-transmissive portions and, from the top view in FIG. 23, the portions of the metrology pattern 2340 outside the alignment marks are relatively transmissive portions. Within the metrology pattern 2440 in FIG. 24, the alignment marks 1744 correspond to the relatively non-transmissive portions and, from the top view in FIG. 24, the portions of the metrology pattern 2440 outside the alignment marks are relatively transmissive portions.

The difference in transmission percentages between the relatively transmissive portions and the relatively non-transmissive portions is at least 25%. In the same or different implementation, (1) no more than 25% of the radiation is transmitted through the relatively non-transmissive portions, (2) at least 75% of the radiation is transmitted through all of the relatively transmissive portions, or (3) no more than 25% of the radiation is transmitted through the relatively non-transmissive portions and at least 75% of the radiation is transmitted through all of the relatively transmissive portions.

Figure 25:
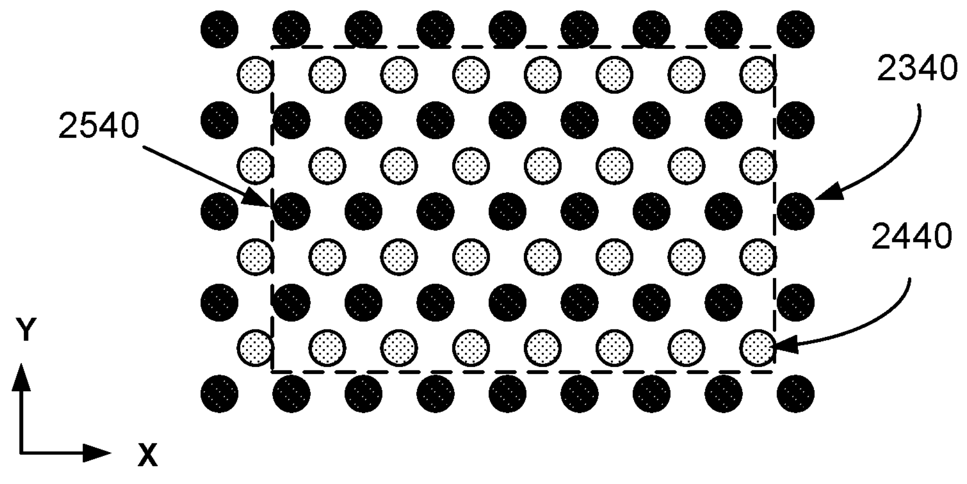
FIG. 25 includes an illustration of a radiation area and the metrology patterns of the dummy source die and the destination site.
Figure 26:
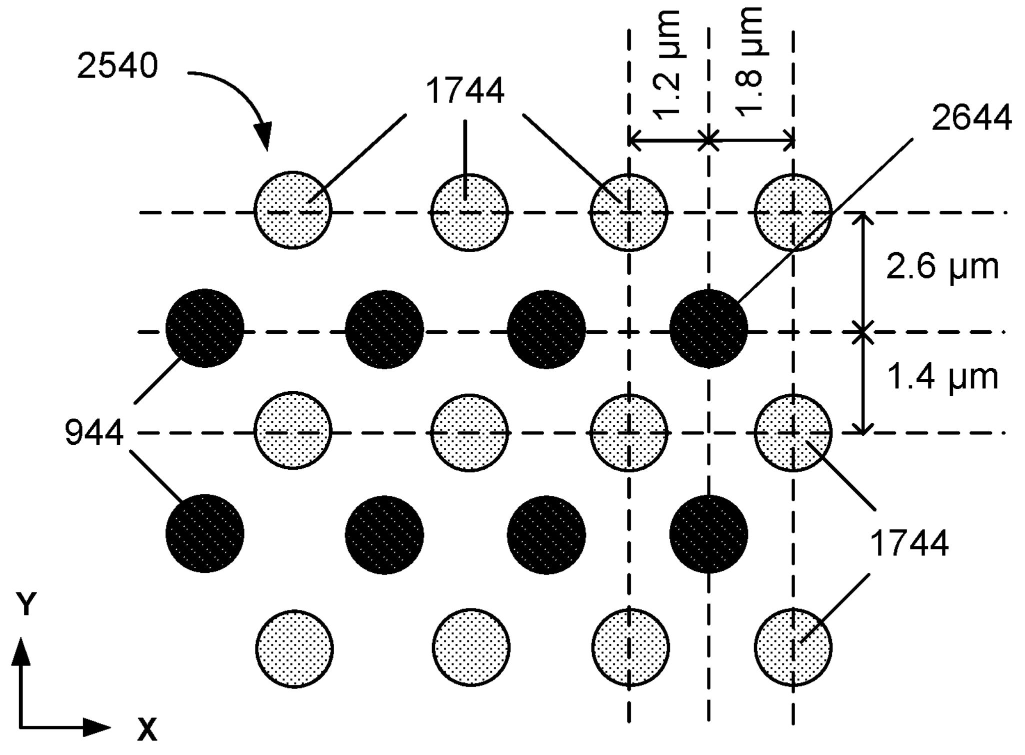
FIG. 26 includes an illustration of a portion of the radiation area of FIG. 25 and the metrology patterns of the dummy source die and the destination site.

FIG. 25 illustrates the metrology patterns 2340 and 2440 after the dummy source die 924 is bonded to a destination site of the destination substrate 748. Radiation area 2540 corresponds to the area that may be used to determine overlay error and is illustrated with a dashed line. FIG. 26 includes a portion of the radiation area 2540 and is described in more detail below with respect to a particular non-limiting example.

The metrology patterns 2340 and 2440 are designed such that the overlay error is zero when the alignment marks (such as the arrays of dummy contact pads for the particular example) within the metrology patterns 2340 and 2440 are phase shifted by an angle of 180°. In an implementation, the phase shift can be in a range from 90° to 270°, in a range from 150° to 210°, or another suitable range that can be useful for determining overlay error. The alignment marks 944 do not overlie any of the alignment marks 1744. The phase shifting can be in one direction or in different directions. Referring to FIG. 25, the metrology patterns 2340 and 2440 are phase shifted in both the X-direction and Y-direction. Phase shifting in more than one direction can help to determine a X-direction compensation for the overlay error, a Y-direction compensation of the overlay error, a rotational compensation (theta) in a plane defined by the X-direction and Y-direction, or the like. The out-of-phase placement can provide for a more accurate overlay error determination as compared to superimposed alignment marks due at least in part to difficulty in detecting the edges of alignment marks, particularly when the alignment marks are made of the same material and are highly reflective. In an implementation, the metrology pattern 2340 is in the form of dummy contact pads of the dummy source die 924 that are identical to, but phase shifted relative to the contact pads within the metrology pattern 2440 of one of the plurality of dies 724. In an implementation, metrology pattern 2440 is in the form of contact pads that are identical to contact pads of a destination site of the destination substrate 748.

The method can include analyzing the radiation data to determine an overlay error between the dummy source die and the corresponding destination site at block 646 in FIG. 6. Radiation data corresponding to the radiation area 2540 can be transmitted to the controller 160 or a local controller. The data may or may not be stored within the memory 162. The data may be transmitted outside to a processor or a memory that is external to the system 100. The data regarding radiation detected and location can be processed by the controller 160, a local controller or a computer that is external to the system 100 can be further processed to determine the overlay error. The following paragraphs describe different ways to analyze the radiation data. Each of the different ways or a combination of such ways can be used for the analysis.

An image can be generated from the radiation data. Imaging can be performed using radiation data to generate an image corresponding to the radiation area 2540. The radiation area may include all of the metrology pattern 2340, the metrology pattern 2440, or both or may include a portion, and not all, of either or both of the metrology patterns 2340 and 2440. In FIG. 25, the radiation area 2540 includes portions of the metrology patterns 2340 and 2440.

Imaging of the radiation area 2540 can be aided in view of some considerations. Imaging may be performed with the radiation detector having a depth of focus that can focus on the alignment marks within the metrology patterns 2340 and 2440. The depth of focus may be at most 9 μm, at most 7 μm, or at most 5 μm. In a particular implementation, alignment marks 944 and 1744 can be arrays of dummy contact pads that lie at the bonding surfaces of the dummy source die 924 and the corresponding destination site. The thickness of the dummy contact pads may be in a range from 1 μm to 4 μm. The limit on the depth of focus can reduce the likelihood of other metal or metal alloy components lying at lower elevations within the destination site, such as the interconnects 1704 and conductive plugs 1706, from being in focus. Such components may not be seen or may be blurred. The depth of focus may be adjusted to the particular thicknesses used for the alignment marks 944 and 1744. Thus, the depth of focus may be significantly less than 9 μm or could be greater than 9 μm when no components adjacent to the metrology pattern 2440 would interfere with imaging. In the same or different implementation, the other metal or metal alloy components lying at lower elevations within the destination site may be blurred.

After an image has been generated, the controller 160, a local controller, or a computer external to the system 100 can determine an X-direction offset, a Y-direction offset, a rotational offset, or a combination thereof between the metrology patterns 2340 and 2440 within the radiation area 2540. Alternatively, a human operator may direct the controller 160, a local controller, or a computer external to the system 100 to use the image and measure the X-direction offset, the Y-direction offset, the rotational offset, or a combination thereof between the metrology patterns 2340 and 2440 within the radiation area 2540.

Analysis of the radiation data can be performed without generating an image. The radiation data may be collected by scanning many rows in the X-direction or many columns in the Y-direction of the radiation area 2540. The alignment marks 944 and 1744 absorb, reflect, or a combination of absorb and reflect substantially more radiation as compared to locations between the alignment marks 944 and 1744, and substantially more radiation can be transmitted between the alignment marks 944 and 1744 as compared to through the alignment marks 944 and 1744.

Referring to FIGS. 22 to 26, when the radiation detector 478 receives reflected radiation, the alignment marks 944 and 1744 reflect substantially more radiation than locations where the alignment marks 944 and 1744 are not present. In an implementation, the radiation detector 478 can output a relatively high signal when the radiation detector 478 is detecting radiation reflected by alignment marks 944 and 2644 (see FIG. 22) and 1744 and can output a relatively low signal when the radiation detector 478 is detecting radiation reflected between alignment marks 944 and 1744. For a radiation detector under the destination substrate 748, the radiation detector may detect radiation transmitted through the dummy source die 924 and through all or part of the destination site of the destination substrate 748. In this implementation, the radiation detector can output a relatively low signal corresponding to the alignment marks 944 and 1744 and, if present within the metrology pattern 2440, the interconnects 1204 and the conductive plugs 1206 and can output a relatively high signal when the radiation detector 478 is detecting radiation reflected between alignment marks 944 and 1744. Examples described below are based on reflected radiation unless stated explicitly to the contrary.

The controller 160, a local controller, or a computer external to the system 100 can use the difference in signal amplitudes and location information to determine the sizes and locations of the alignment marks 944 and 1744 and the pitch corresponding to the metrology patterns 2340 and 2440 within the radiation area 2540 in FIG. 25. The pitch can be a size of a feature and a space between the feature and an immediately adjacent feature in a particular direction, such as the X-direction or the Y-direction. An X-direction pitch may be the same or different from the Y-direction pitch. The features can be a pair of the alignment marks 944 or the alignment marks 1744. As an non-limiting example, the radiation data can include scans along rows where a scan may provide a signal similar to one illustrated in FIG. 22. The scan having the widest signal for the particular alignment mark 2644 can be analyzed. Referring to FIGS. 22 and 26, the alignment mark 944 closest to the right-hand side can be the particular alignment mark 2644. For the scan, the center 2664 of signal closest to right-hand side is at a particular location, such as 2.5 μm from the right-hand side of the radiation area 2540 when alignment marks 944, including the particular alignment mark 2644, have an X-direction dimension, such as a width or a diameter, of 1.0 μm and the X-direction spaces between alignment marks 944, including the particular alignment mark 2644, of 2.0 μm.

The Y-direction dimension may be obtained by identifying to which row the scan belongs. A scan may refer to one or more lines of an image obtained by a CCD or one or more lines obtained by scanning using an optical component. As a further example, Scan 0 may be along the upper border (closest to top of FIG. 25) of the radiation area 2540 and each subsequent scan is displaced in the Y-direction by 0.1 μm toward the bottom of FIG. 25 from its immediately preceding scan. The scan data in FIG. 22 may correspond to Scan 97, and thus, the center of the alignment mark is 97 scans times 0.1 μm/scan, or 9.7 μm, from the upper border of the radiation area 2540. Thus, the center of the particular alignment mark 2644 is 2.5 μm from the right-hand side of the radiation area (X-direction coordinate) and 9.7 μm from the top of the radiation area 2540 (Y-direction coordinate). The other alignment marks within the radiation area 2540 can be analyzed in the same way.

Referring to FIGS. 23 to 26, the controller 160, a local controller, or a computer external to the system 100 may have some information regarding the radiation area 2540, for example, the alternating rows or alternating columns arrangement of alignment marks 944, including the particular alignment mark 2644, and 1744. The controller 160, a local controller, or a computer external to the system 100 can use the X-direction coordinates and Y-direction coordinates for the alignment marks 944 and 1744 to determine pitches corresponding to the alignment marks 944 and 1744 and an overlay error based on the radiation data collected for the radiation area 2540.

Spatial frequency analysis may be performed on the metrology patterns 2340 and 2440 for the radiation data collected from the radiation area 2540. The spatial frequency analysis can be performed in the spatial frequency domain with or without an image of the radiation area 2540. The spatial frequency analysis may be performed using a value that is based on a detected pitch and feature size. The spatial frequency may be set to exclude features, such as word lines, bit lines, or other interconnects, and isolated features. In view of the foregoing, the pitch divided by the feature size is a quotient and the value for spatial frequency analysis can be the quotient+/−10% to account for manufacturing or other variances. In an alternative implementation, optical techniques may be used to blur out features that are at a plane that is not of interest. The value may be in a range from 1.5 to 9.0.

The word lines or the bit lines may not have a pitch in one of the directions, or, when present, segmented word lines or segmented bit lines can have relatively large lengths in a direction and have relatively small spaces between the segments in that same direction. Thus, for a segmented bit line or a segmented word line, the quotient (the pitch divided by the feature size) will be less than 1.1.

Isolated features may not have a pitch or have a relatively small feature size and a relatively large spaces between the isolated features. If the isolated features have a pitch, the pitch divided by the feature size may exceed 10, 50, or more. Alternatively, the isolated features may vary greatly in size. An X-direction dimension, a Y-direction dimension, or both may be as little as 1.0 μm or as large as 10 μm, 50 μm, or more. The spatial frequency analysis may include a lower limit, an upper limit, or both for the X-direction dimension, the Y-direction dimension, or both. A non-limiting example, each alignment marks 944 and 1744 may be designed to have an X-direction dimension of 1.5 μm and a Y-direction dimension of 1.5 μm. In practice, the X-direction dimension and Y-direction dimension may vary by up to 0.2 μm due to manufacturing or other variations. Thus, the features will have X-direction dimensions and Y-direction dimensions that are in a range from 1.3 μm to 1.7 μm.

The spatial analysis may be performed only on features that meet one or more of (1) the value associated with the quotient (pitch divided by feature size), (2) feature size (X-direction dimension, Y-direction dimension, or both)), another suitable criterion, or a combination thereof.

Analysis of the radiation data can include comparing an image corresponding the radiation area 2540 to a standard image corresponding to the radiation area 2540. The standard image may be an image from a different bonded dummy source die bonded to a different destination site of a different destination substrate, where the bonded different die and different destination site has no or a relatively low overlay error. In the same or another implementation, the standard image may be a computer-generated image corresponding to zero overlay error. The computer-generated image may be based on theoretical data and not include actual radiation data from bonded dies.

Pattern recognition can be useful for both reflective and transmission radiation modes and can be particularly useful when radiation is transmitted through the destination substrate 748. The metrology pattern 2440 may have other features that are close to or underlie the metrology pattern 2440 of the destination site, such as the interconnects 1204 and conductive plugs 1206. Pattern recognition can determine that the other features are not part of the metrology pattern 2440, and such other features may be excluded from the analysis when determining overlay error.

As previously described, different techniques can be performed when analyzing the radiation data or a derivative thereof (for example, an image generated from the radiation data). The analysis can be performed using any particular technique or a combination of the techniques may be used. The analysis can continue further to determine an overlay error between the dummy source die 924 and its corresponding destination site.

As illustrated in FIG. 25, the alignment marks 944 are offset in both the X-direction and the Y-direction relative to the alignment marks 1744. The radiation data can be used to determine whether and by how much at least some of the alignment marks 944 are from the alignment marks 1744, or by how much at least some of the alignment marks 1744 are from the alignment marks 944. Below is a non-limiting example meant to illustrate and not limit the scope of the present invention as defined in the claims. For overlay error, X-direction positive values are closer to the right-hand sides of FIGS. 25 and 26, and Y-direction positive values are closer to the tops of FIGS. 25 and 26.

Referring to FIGS. 25 and 26, each of the alignment marks 944, including the particular alignment mark 2644, and 1744 can have a 1.0 μm diameter. In the X-direction (along a row of alignment marks), the spaces between the alignment marks 944 is 2.0 μm, and the spaces between the alignment marks 1744 is 2.0 μm. The X-direction pitch for the alignment marks 944 is 3.0 μm, and the X-direction pitch for the alignment marks 1744 is 3.0 μm. In the Y-direction (along a column of alignment marks), the spaces between the alignment marks 944 is 3.0 μm, and the spaces between the alignment marks 1744 is 3.0 μm. The Y-direction pitch for the alignment marks 944 is 4.0 μm, and the Y-direction pitch for the alignment marks 1744 is 4.0 μm.

The metrology patterns 2340 and 2440 are designed such that the alignment marks 944 and 1744 are 180° out of phase of each other in each of the X-direction and the Y-direction when there is no overlay error. Accordingly, when the alignment marks 944 and 1744 are 180° out of phase compared to each other, along a row of the alignment marks 944 (X-direction), the centers of the alignment marks 944 are 1.5 μm from each of lines defined centers of the alignment marks 1744 in immediately adjacent columns of the alignment marks 1744. Along a column of the alignment marks 944 (Y-direction), the centers of the alignment marks 944 are 2.0 μm from each of lines defined centers of the alignment marks 1744 in immediately adjacent rows of the alignment marks 1744.

FIG. 26 illustrates how overlay error can be determined based on the previously described pitches and X-direction and Y-direction offsets based on the metrology pattern 2340 and 2440. In FIG. 26, as previously noted, the alignment mark 2644 is a particular one of the alignment marks 944 and used to improve understanding of how to determine an overlay error.

In the particular example, the alignment mark 2644 is 1.2 μm from the line defined by centers of the alignment marks 1744 in the column just to the left of the alignment mark 2644, and 1.8 μm from the line defined by centers of the alignment marks 1744 in the column just to the right of the alignment mark 2644. For zero overlay error, both distances would be 1.5 μm. The alignment mark 2644 is 0.3 μm closer to the left-hand side of FIG. 26 than it should be. Thus, the overlay error is −0.3 μm in the X-direction.

Continuing with the same example, the alignment marks 2644 is 2.6 μm from the line defined by centers of the alignment marks 1744 in the row just above the alignment mark 2644, and 1.4 μm from the line defined by centers of the alignment marks 1744 in the row just below the particular alignment mark 944. For zero overlay error, both distances would be 2.0 μm. The alignment mark 2644 is 0.6 μm closer to the bottom of FIG. 26 than it should be. Thus, the overlay error is −0.6 μm in the Y-direction. The overlay error between the dummy source die 924 and the destination site is −0.3 μm in the X-direction and −0.6 μm in the Y-direction.

The overlay error may or may not have a rotational component. For example, the line defined by the centers of a row or column of the alignment marks 944 should be parallel to lines defined by the centers of immediately adjacent rows or columns of the alignment marks 1744. When rotational overlay error is present, a line corresponding to the alignment marks 944 intersects a line corresponding to the alignment marks 1744. The intersection of the lines may occur within the radiation area 2540 or outside the radiation area 2540. For this particular example, there is no rotational overlay error.

The method can include determining an overlay error compensation based at least in part on the overlay error at block 648 in FIG. 6. Continuing with the example, when a source die is subsequently positioned, the compensation to the overlay error will be for the same values but in opposite directions from the overlay error. Thus, with respect to the dummy source die, the dummy source die 924 should have been 0.3 μm closer to the right-hand side of FIG. 26 (X-direction overlay error compensation of +0.3 μm) and 0.6 μm closer to the top of FIG. 26 (Y-direction overlay error compensation of +0.6 μm). Alternatively, with respect to the destination substrate 748, the destination substrate 748 should have been 0.3 μm closer to the left-hand side of FIG. 26 (X-direction overlay error compensation of −0.3 μm) and 0.6 μm closer to the bottom of FIG. 26 (Y-direction overlay error compensation of −0.6 μm).

When positioning the next source die or its corresponding destination site of the destination substrate 748, the next source die should be 0.3 μm closer to the right-hand side of FIG. 26 to compensate for the X-direction overlay error and 0.6 μm closer to the top of FIG. 26 to compensate for the Y-direction overlay error. The prior example included many specific details. The overlay error may be determined for a plurality of alignment marks 944 rather than just one alignment mark.

The method can continue with other dies to be bonded to other destination sites of the destination substrate 148. This part of the method corresponds to the process flow diagram in FIGS. 27 and 28 and illustrations in FIGS. 29 to 37.

Figure 27:
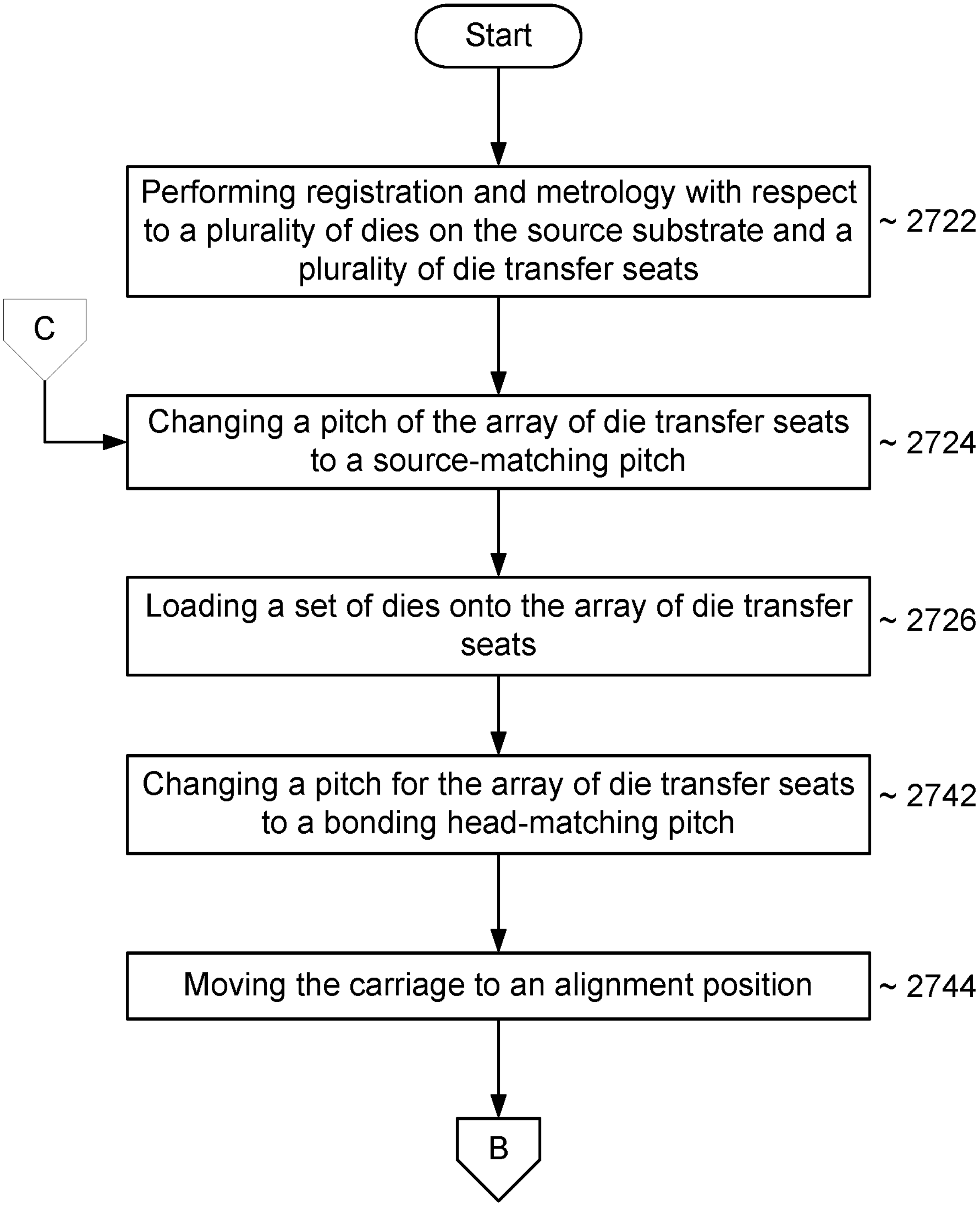
FIGS. 27 and 28 include a process flow diagram for transferring source dies to destination sites of a destination substrate.

The method includes performing registration and metrology with respect to a plurality of dies on the source substrate and a plurality of die transfer seats at block 2722 in FIG. 27.

Figure 29:
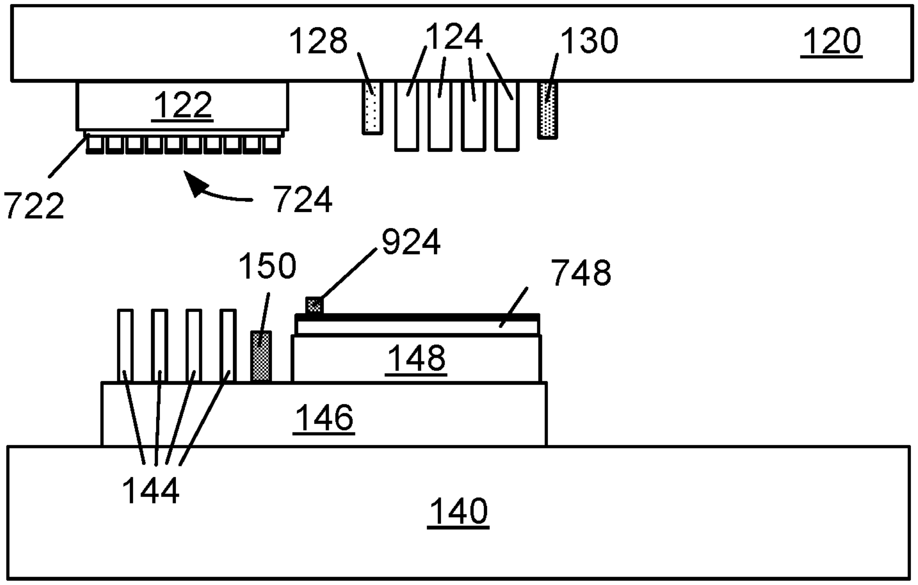
FIG. 29 includes an illustration of a cross-sectional view of the system after moving the carriage under a plurality of source dies coupled to the source substrate chuck.

Referring to FIG. 29, the registration and metrology operations can be performed with respect to the plurality of dies 724 and the array of die transfer seats 144. The optical component 150 can be used to collect information regarding the plurality of dies 724. The information from the optical component 150 can be transmitted to the controller 160 or a local controller and used to determine the source pitch for the plurality of dies 724 coupled to the source substrate chuck 122. The source pitch can include an X-direction source pitch, a Y-direction source pitch, or both the X-direction and Y-direction source pitches. If needed or desired, the information may be used to identify or confirm dies within the plurality of dies 724 are in the correct relative locations for the destination sites of the destination substrate 748. The plurality of dies 724 can be production source KGDs that will be bonded to KGDs 824 of the destination substrate 748.

The method can further include changing a pitch of the array of die transfer seats to a source-matching pitch at block 2724 in FIG. 27. The source-matching pitch can be the same as or within an allowable tolerance of the source pitch. Similar to the source pitch, the source-matching pitch can include an X-direction source-matching pitch, a Y-direction source-matching pitch, or both the X-direction and Y-direction source-matching pitches. The allowable tolerance may account for slight differences that can be attributed to the equipment or repeatability of a manufacturing process. As used herein, an allowable tolerance can be within 2.0%, 1.0%, or 0.5% of the desired value. For example, the source-matching pitch can be within 2.0%, 1.0%, or 0.5% of the source pitch.

Figure 30:
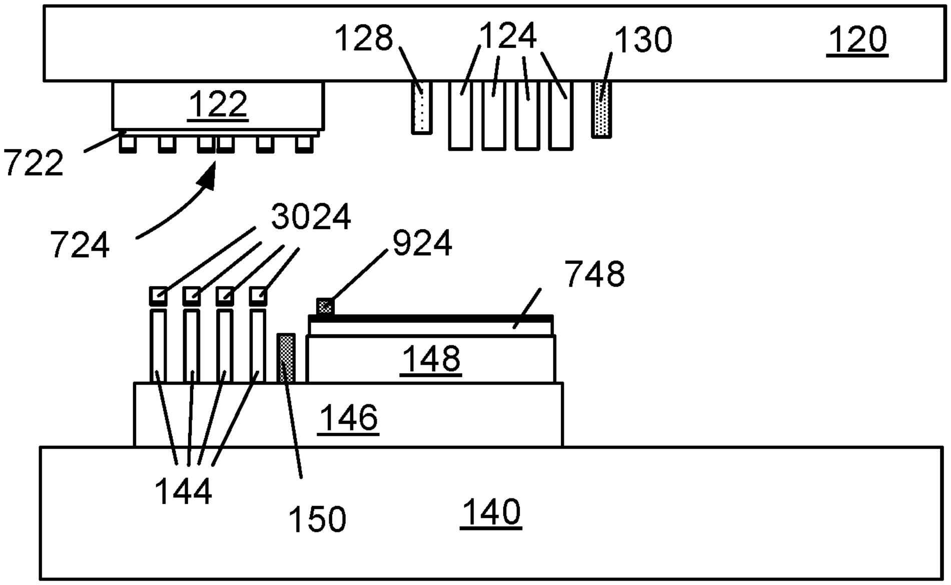
FIG. 30 includes an illustration of a cross-sectional view of the system of FIG. 29 after transferring a set of source dies to an array of die transfer seats.

The method can include loading a set of dies onto the array of die transfer seats at block 2726 in FIG. 27. Referring to FIG. 30, die chucks of the array of die transfer seats 144 can be extended toward the source substrate 722, pick up a set of dies 3024, and retract the die chucks away from the source substrate 722. The set of dies 3024 can be a set of production source KGDs. Picking up the dies is a particular type of loading. Another type of loading with respect to the system 100 can be to load any or all of the die transfer seats using the die loading machine 180 that was used to load the dummy source die 924. With respect to the source substrate 722, the dies that are picked up may be dies that are closest to each other, or one or more other dies may be between the picked-up dies, such as illustrated in FIG. 30. Within the plurality of dies 724, dies not picked up remain coupled to the source substrate chuck 122 as illustrated in FIG. 30.

In an implementation, the die chucks of the array of die transfer seats 144 do not contact the activated surfaces of the set of dies 3024. The die chucks of the array of die transfer seats 144 may be Bernoulli chucks. Although the set of dies 3024 are held by the die chucks, the set of dies 3024 are drawn in FIG. 30 as being spaced apart from the array of die transfer seats 144 to illustrate that the activated surfaces of the dies do not contact the die transfer seats. The array of die transfer seats 144 can have a design that allows dies to be picked up along side surfaces of the dies, where the lateral side surfaces are between the device and back sides of the dies.

If a die is too thin to be held by its sides, a backing plate can be coupled to the die. For example, a die may have a thickness of less than 50 μm. A thickness of the backing plate or a combined thickness of the backing plate and die is sufficient to allow a pick-up head to pick up the backing plate or a combination of the backing plate and die without having an activated surface of the die contacting the pick-up head. The backing plate can have a thickness in a range from 100 μm to 500 μm.

The backing plate can be coupled to the die using an adhesive compound. The backing plate may be removed at a later time or remain coupled to the die in the finished electrical device. After the die is bonded to the destination substrate 748, the backing plate may be removed. In an implementation, the adhesive compound may be deactivated by exposure to actinic radiation. The actinic radiation may be in a range from 100 nm to 1000 nm. In such an implementation, at least 70% of the actinic radiation is to be transmitted through the backing plate. In another implementation, a solvent can be used to remove the adhesive compound from between the die and the backing plate.

In another implementation, a die may not have an activated surface but has a relatively fragile component along a surface that will be bonded to the destination substrate 748, and such surface should not contact a die transfer seat within the array of die transfer seats 144. A die transfer seat as described with respect to the die having the activated surface can be used for the die with a fragile component along the surface facing the die transfer seat.

In a further implementation, the die chucks for the array of die transfer seats 144 can have a design where the die chucks contact the bottom-facing surfaces of the set of dies 3024. After reading this specification in its entirety, skilled artisans will be able to determine whether the array of die transfer seats 144 should or should not contact device sides or back sides of the dies and determine a design that meets the needs or desires for a particular application.

The method can further include changing a pitch for the array of die transfer seats to a bonding head-matching pitch at block 2742 in FIG. 27. The bonding head-matching pitch can be the same or within an allowable tolerance of the bonding head pitch for the array of bonding heads 124. The bonding head-matching pitch and the bonding head pitch can include an X-direction bonding head-matching pitch, a Y-direction bonding head-matching pitch, or both the X-direction and Y-direction bonding head-matching pitches. The allowable tolerance may account for slight differences that can be attributed to the equipment or repeatability of a manufacturing process. As used herein, an allowable tolerance can be within 2.0%, 1%, or 0.5% of the desired value. For example, the bonding head-matching pitch can be within 2.0%, 1%, or 0.5% of the bonding head pitch.

Figure 31:
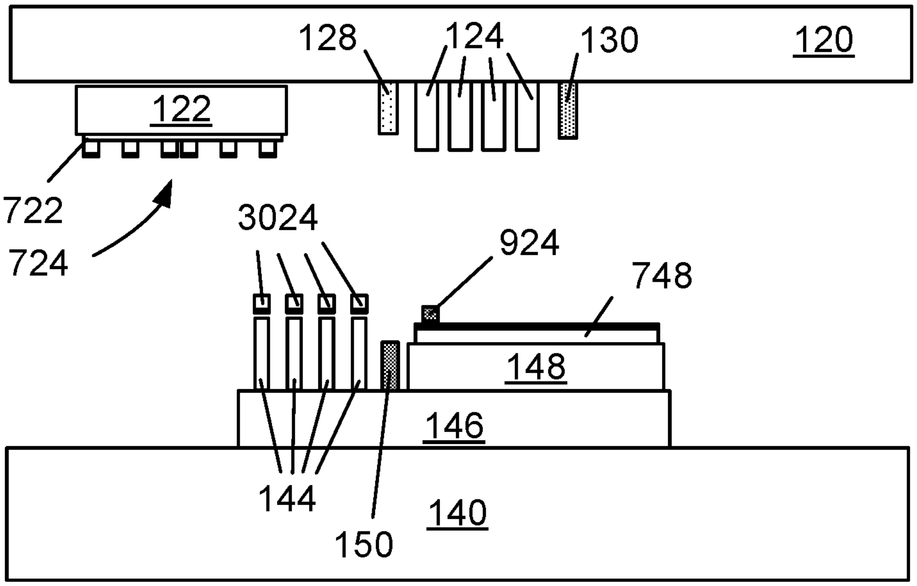
FIG. 31 includes an illustration of a cross-sectional view of the system of FIG. 30 when positioning the carriage using the optical component under the alignment reference coupled to the bridge.

The method can include moving the carriage to an alignment position at block 2744 in FIG. 27. In FIG. 31, the carriage 146 is moved so that the alignment reference 128 is over the optical component 150. Information collected from the optical component 150 can be received by the controller 160 or a local controller. The controller 160 or a local controller can use the information regarding a subsequent movement of the carriage 146 to a desired location.

Figure 32:
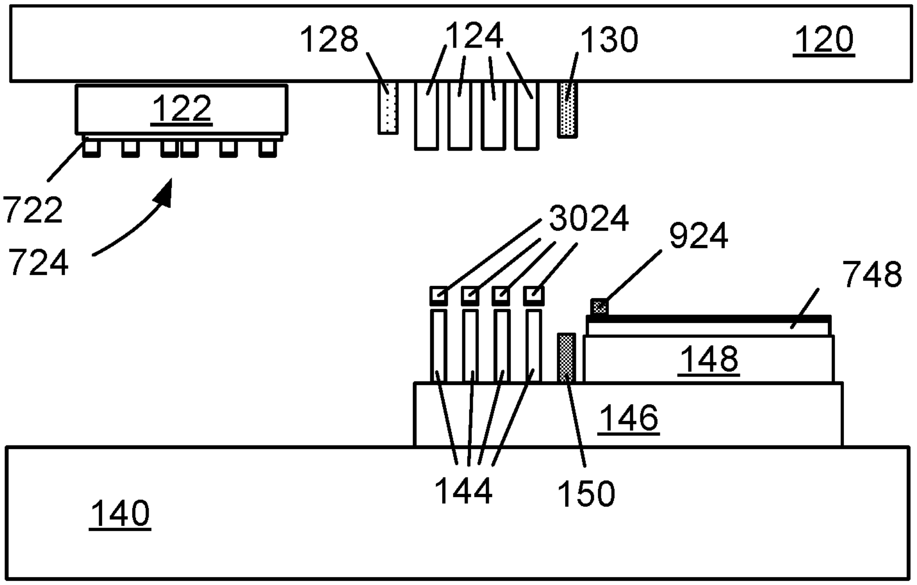
FIG. 32 includes an illustration of a cross-sectional view of the system of FIG. 31 after positioning the set of source dies under an array of bonding heads.

The method can further include moving the carriage 146 so that the set of dies 3024 can be transferred from the array of die transfer seats 144 to the array of bonding heads 124. In an implementation as illustrated in FIG. 32, the carriage 146 is moved so that the array of bonding heads 124 are over the set of dies 3024. The movement can include moving the carriage 146 in an X-direction, a Y-direction, rotating the carriage along an X-Y plane, or a combination thereof.

Figure 28:
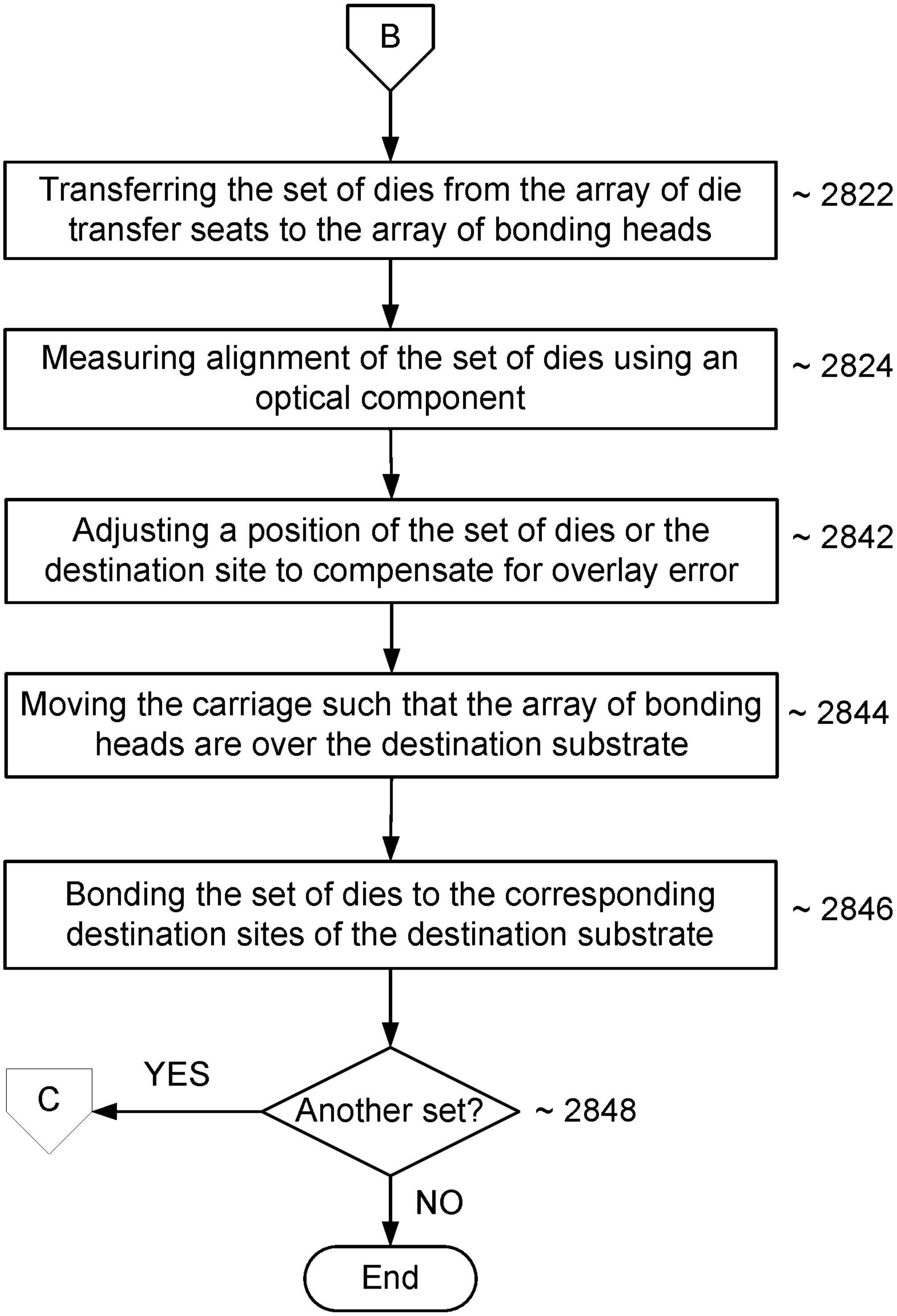
Figure 33:
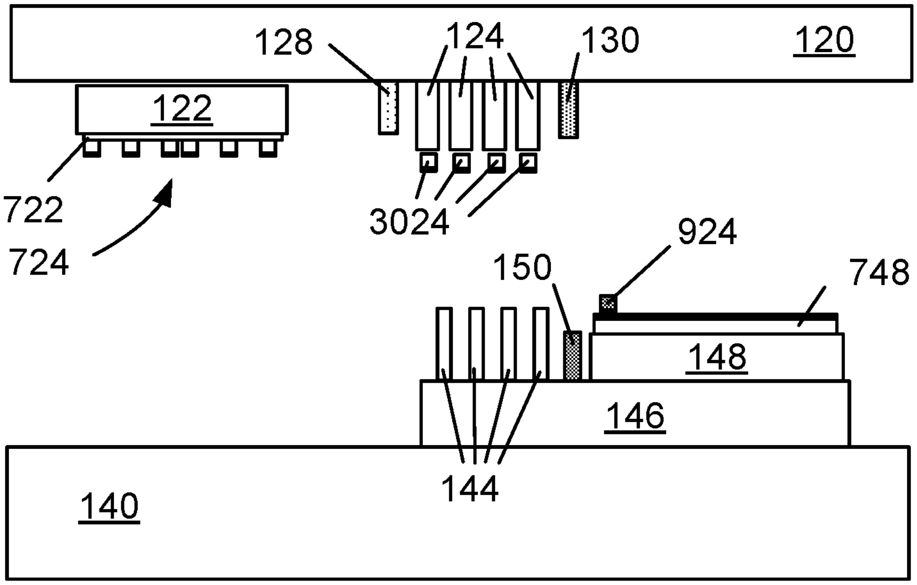
FIG. 33 includes an illustration of a cross-sectional view of the system of FIG. 32 after transferring the set of dies from the array of die transfer seats to the array of bonding heads.

The method can further include transferring the set of dies from the array of die transfer seats to the array of bonding heads at block 2822 in FIG. 28. The die chucks for the array of die transfer seats 144 can be extended toward the array of bonding heads 124, the die chucks for the bonding heads within the array of bonding heads 124 can be extended toward the array of die transfer seats 144, or both. FIG. 33 includes the set of dies 3024 after transferring the set from the array of die transfer seats 144 to the array of bonding heads 124.

Figure 34:
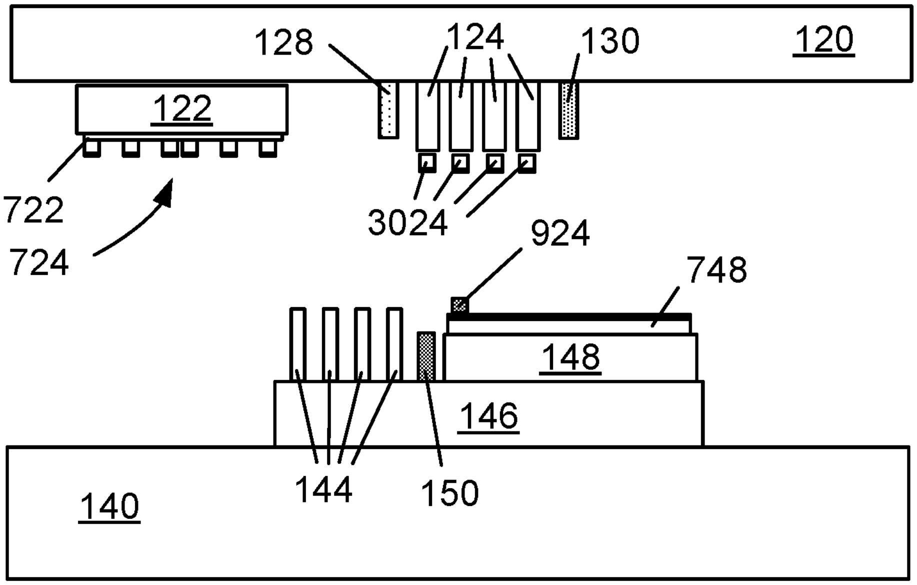
FIG. 34 includes an illustration of a cross-sectional view of the system of FIG. 33 when measuring alignment error associated with a particular source die.
Figure 35:
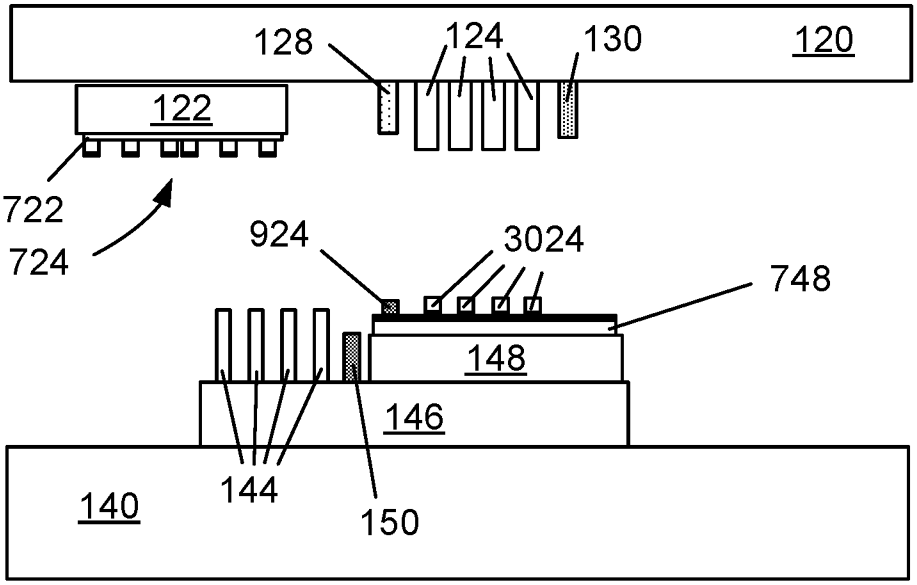
FIG. 35 includes an illustration of a cross-sectional view of the system of FIG. 34 after bonding the set of source dies to destination sites of the destination substrate.

The method can include measuring alignment of the set of dies using an optical component at block 2824 in FIG. 28. The optical component 150 coupled to the carriage 146 may be used in positioning any one or more of the dies within the set of dies 3024, measuring alignment error of the set of dies 3024, or both as illustrated in FIG. 34. Better positioning of the dies can be accomplished by measuring an alignment error as a position of each die on each bonding head relative to an ideal position of the die on the bonding head. Information from the optical component 150 can be sent to and received by the controller 160 or a local controller. The controller 160 or a local controller can use the information to determine an alignment error and an amount of positioning of the die so that the die will be more closely aligned to its corresponding destination site of the destination substrate 748. The controller 160 or a local controller can transmit a signal, so that the position of each die is adjusted by moving the die chuck of the bonding head using the limited range of motion of the die chuck relative to its corresponding body. Thus, in an implementation, moving the die chuck allows the position of the die to be adjusted relative to the destination substrate 748 that is held by the destination substrate chuck 148. Positioning and measuring alignment error may be performed iteratively until the alignment error is zero or an acceptably low value.

The method can also include adjusting a position of the set of dies or the destination site to compensate for overlay error at block 2842 in FIG. 28. Adjusting the position to compensate for the overlay error may or may not be performed in addition to adjusting the position to achieve proper alignment. The adjustment compensates for the overlay error between the dummy source die 924 and its corresponding destination die and can allow for better electrical and physical connection between the active contact pads of the set of dies 3024 and active contact pads of the destination sites of the destination substrate 748 when the set of dies 3024 are subsequently bonded to the destination substrate 748. Ideally, the overlay error compensation completely compensates for the overlay error; however, due to manufacturing variability or differences between the dummy source die and production source dies, the overlay error compensation may undercompensate or overcompensate for the overlay error.

Figure 36:
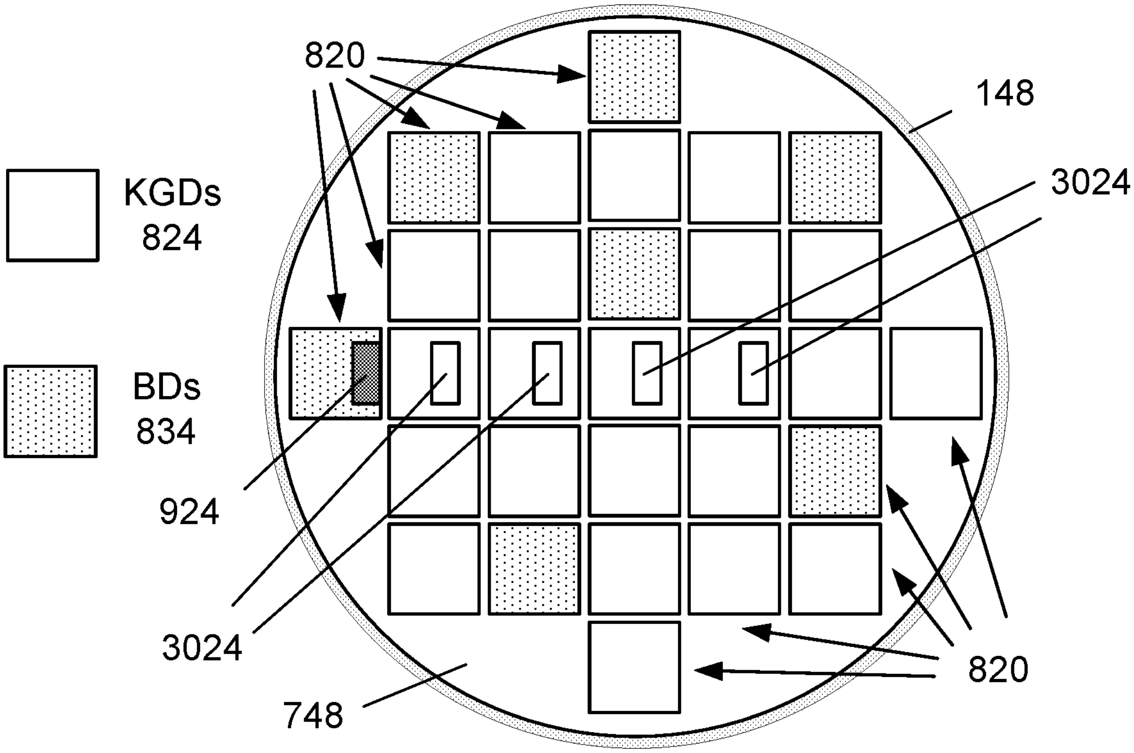
FIG. 36 includes an illustration of a top view of the destination substrate chuck and the destination substrate of the system of FIG. 35 after bonding the set of source dies to their corresponding destination sites.

With respect to positioning of dies, the overlay error compensation will be in the direction opposite of the overlay error. Regarding the particular example described with respect to FIG. 26, the X-direction overlay error is −0.3 μm, and the Y-direction overlay error is −0.6 μm. When positioning the set of dies 3024, the X-direction overlay error compensation is +0.3 μm, and the Y-direction overlay error compensation is +0.6 μm. Before bonding, the position of the set of dies 3024 can be adjusted by moving the set of dies 3024 by +0.3 μm in the X-direction and +0.6 μm in the Y-direction. Referring briefly to FIG. 36, before bonding the set of dies 3024, the set is moved to the right by 0.3 μm and toward the top by 0.6 μm.

In an alternative implementation, the destination substrate 748 may be positioned instead of positioning the set of dies 3024. With respect to positioning of the destination substrate 748, the overlay error compensation will be in the same direction as the overlay error. When positioning the destination substrate 748, the X-direction overlay error compensation is −0.3 μm, and the Y-direction overlay error compensation is −0.6 μm. Before bonding, the position of the destination substrate 748 can be adjusted by moving the set of dies 3024 by −0.3 μm in the X-direction and −0.6 μm in the Y-direction. Referring briefly to FIG. 36, before bonding the set of dies 3024, the destination substrate 748 can be moved by −0.3 μm in the X-direction (to the left) and −0.6 μm in the Y-direction (toward the bottom).

The overlay error may include a rotational component. In the example, the overlay does not include a rotational component. However, in another implementation, the overlay error may include a rotational component having an angle θ in a counterclockwise direction (−θ). When positioning the set of dies 3024, the overlay error compensation can rotate the set of dies 3024 by an angle θ in a clockwise direction (+θ). When positioning the destination substrate 748, the overlay error compensation can rotate the destination substrate 748 by an angle θ in a counterclockwise direction (−θ).

The method can be used to compensate for X-direction overlay error, Y-direction overlay error, rotational overlay error, or a combination thereof. Compensating for overlay error allows for a more accurate bonding of active contact pads between source die and destination sites of the destination substrate. Compensating for the overlay error may be performed before or after adjusting the position of the set of dies 3024 regarding misalignment (block 2824 in FIG. 28) or moving the carriage 146 as described below with respect to block 2844.

The method can include moving the carriage such that the array of bonding heads are over the destination substrate at block 2844 in FIG. 28. The carriage 146 is moved so that the set of dies 3024 are over destination sites for the destination substrate 748.

The method can further include bonding the set of dies to the corresponding destination sites of the destination substrate at block 2846 in FIG. 28. The die chucks for the array of bonding heads 124 can be extended toward the destination substrate 748, the destination substrate chuck 148 can be extended toward the array of bonding heads 124, or both. Pressure is exerted to bond the set of dies 3024 to corresponding destination sites of the destination substrate 748 in FIG. 35. In an implementation, the bonds can be oxide-to-oxide bonds. The pressure during bonding can be in a range 0.5 N/cm$^2$ to 20 N/cm$^2$. The bonding can be performed at room temperature (for example, at a temperature in a range from 20° C. to 25° C.) or higher. Bonding is performed at a temperature less than a subsequent anneal to expand conductive metal within the dies and at the destination sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

Figure 37:
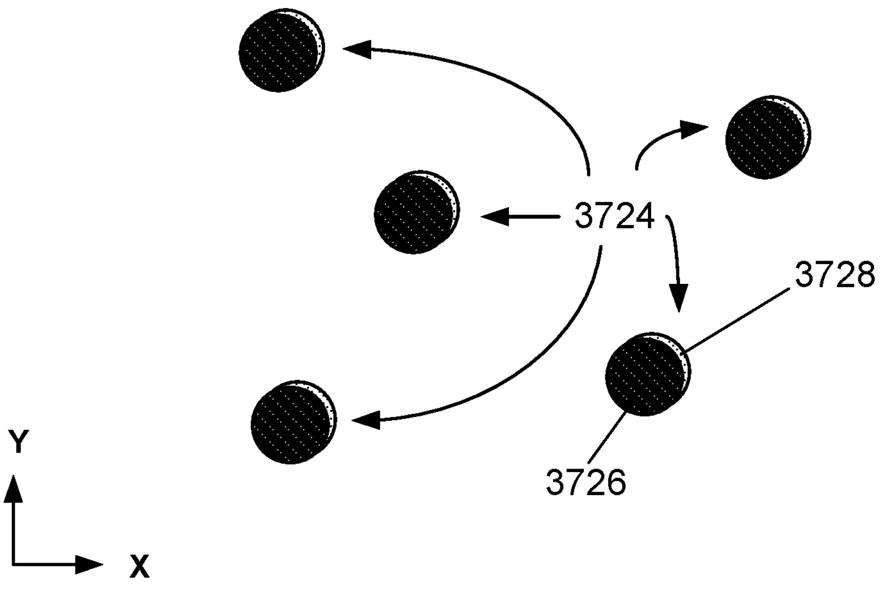
FIG. 37 includes an illustration of a top view of active contacts of a source die and a destination site of the destination substrate.

FIG. 36 includes a top view of the destination substrate chuck 148 and the destination substrate 748 after the set of dies 3024 are bonded to corresponding destination sites of the destination substrate 748. The destination sites are parts of the KGDs 824 of the destination substrate 748. FIG. 37 includes a top view of bonded contact pads 3724 at a destination site. An interconnect, an electrical circuit element, an electrical circuit including electrical circuit elements, or a combination thereof are present within the source die and the KGD 824 but are not illustrated in FIG. 37 to simplify understanding of how active contact pads between the source die and the KGD 824 overlap each other.

Each of the bonded contact pads 3724 can include an active contact pad 3726 of a source die within the set of dies 3024 and an active contact pad of the corresponding destination site of a KGD 824. The overlap between the active contact pads is very good but not exact. The adjustment nearly, but not completely, compensated for the overlay error. Thus, adjusting the position using the overlay error compensation undercompensated for the overlay error between the source die and its corresponding destination site for the particular example. In another example with different source dies, the adjustment using the overlay error compensation can completely compensate or overcompensate for the overlay error between the dummy source die 924 and its corresponding destination site of the destination substrate 748.

A determination is made whether another set of dies is to be transferred to the destination substrate at decision diamond 2848 in FIG. 28. If no more dies are to be transferred ("NO" branch), the transfer operation is completed, and the method of transferring dies ends. If more dies are to be transferred ("YES" branch from decision diamond 2848 in FIG. 28), the method continues starting at block 2724 in FIG. 27.

If needed or desired, another dummy source die may be bonded to the destination substrate 748 and used to determine another overlay error. The method can be any of the methods as previously described with respect to FIGS. 5 to 26. The method for the other dummy source die may be the same or different from the method used for the dummy source die 924.

Figure 38:
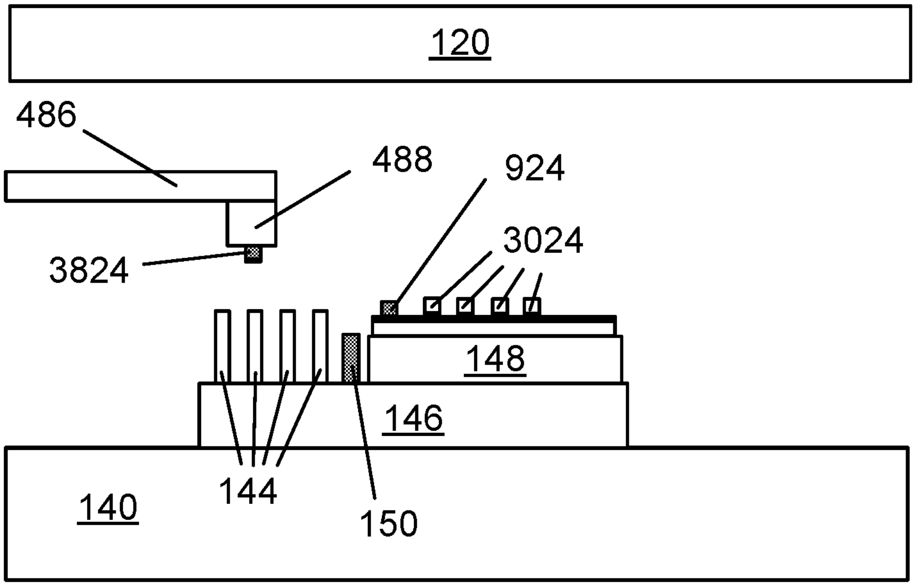
FIG. 38 includes an illustration of a cross-sectional view of the system of FIG. 35 while another dummy source die is held by the die loading machine.
Figure 39:
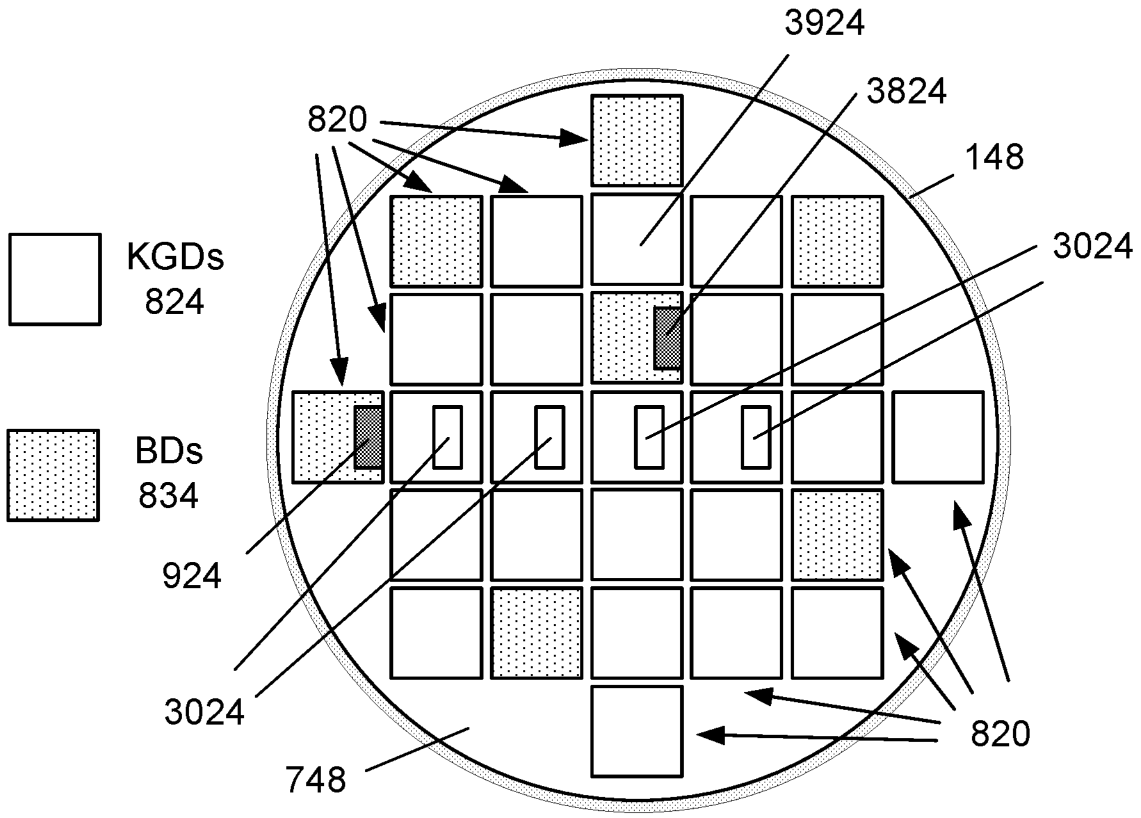
FIG. 39 includes an illustration of a top view of the destination substrate chuck and the destination substrate of the system of FIG. 38 after bonding the other dummy source die to its corresponding destination site.
Figure 40:
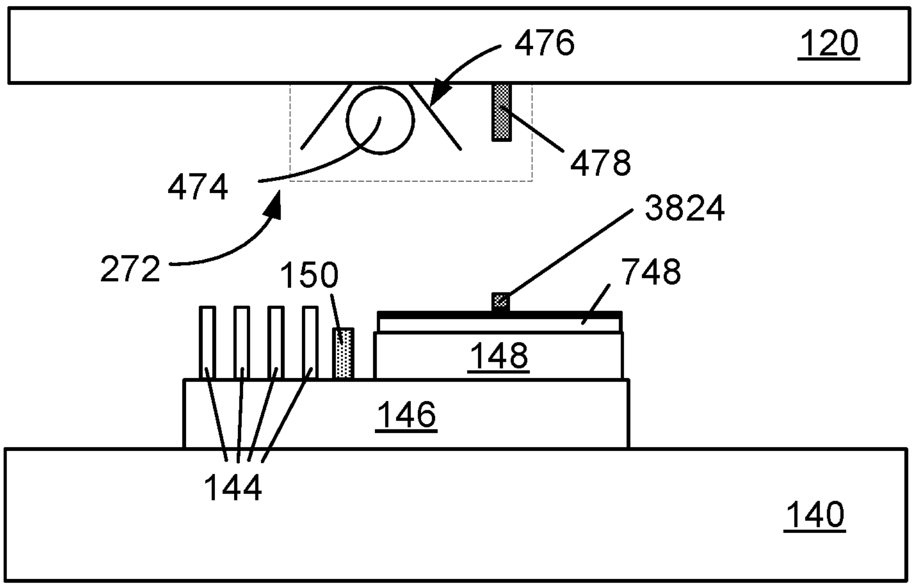
FIG. 40 includes an illustration of a cross-sectional view of the system of FIG. 39 when collecting radiation data related to the other dummy source die and its corresponding destination site.

FIG. 38 includes a cross-sectional view of the system with a dummy source die 3824 being held by the die transfer head 488. The method for the dummy source die 3824 may or may not include adjusting the position of the dummy source die 3824 to compensate for overlay error with respect to the dummy source die 924. FIG. 39 includes a top view of the destination substrate chuck 148 and destination substrate 748 after the dummy source die 3824 is bonded to a destination site of a bad die 834. FIG. 40 includes a cross-sectional view during collecting radiation data corresponding to the metrology patterns of the other dummy source die 3824 and its corresponding destination site of the destination substrate 748. The dummy source die 924 and the set of dies 3024 are present over the destination substrate 748 but are not illustrated in FIG. 40 because FIG. 40 is along a different sectioning plane.

The overlay errors for the dummy source dies 924 and 3824 may be different. The information provided by the overlay error regarding the dummy source die 3824 may depend on when the dummy source die 3824 was bonded as compared to bonding sets of source KGDs.

The bonding of the dummy source die 3824 may be performed before bonding the set of dies 3024 to destination sites the KGDs 824. Radiation data regarding the dummy source die 3824 and its corresponding destination site collected before bonding any source KGD can be helpful to confirm that the overlay error compensation regarding the dummy source die 924 was sufficient or if the overlay error compensation should be changed to reduce the amount of undercompensation or overcompensation associated with the overlay error compensation regarding the dummy source die 924.

The bonding of the dummy source die 3824 may be performed (1) after bonding the set of dies 3024 to destination sites KGDs 824 and before bonding another set of source dies to other destination sites of the destination substrate 748 (hereinafter "intermediate bonding") or (2) after all destination sites of KGDs 824 have been bonded with source KGDs from the plurality of dies 724 (hereinafter "last bonding"). Radiation data regarding the dummy source die 3824 and its corresponding destination site collected for intermediate bonding or last bonding can be helpful to whether the overlay error changed over time since the time of bonding the dummy source die 924. The change may be due to vibration or other movement of any one or combination of components within the apparatus 110, temperature change within the apparatus 110, or another environmental condition change within the apparatus 110.

The difference in overlay errors with the dummy source dies 924 and 3824 may provide other information in addition or in place of the temporal information. Referring to FIG. 39, the center of the destination substrate 748 is closer to dummy source die 3824 than to the dummy source die 924. A center-to-edge variation in overlay errors may be seen based on the overlay errors for the dummy source dies 924 and 3824. As an example, a source KGD and is to be bonded to the destination site of destination die 3924. The destination die 3924 is a particular KGD 824. The different overlay errors may allow overlay error compensations to be predicted based on different locations of the destination substrate 748.

Continuing with the particular example that was previously described, the dummy source die 924 has an X-direction overlay error of −0.3 μm and a Y-direction overlay error of −0.6 μm, where X-direction positive values are closer to the right-hand side of FIG. 36 and Y-direction positive values are closer to the top of FIG. 36. The dummy source die 3824 may have an X-direction overlay error of −0.1 μm and a Y-direction overlay error of −0.2 μm. Referring briefly to FIG. 37, the active contact pads 3726 and 3728 may have the same overlay error as the dummy source die 3824.

The distance from the center of the destination site of the destination die 3924 to the center of the destination substrate 748 may have a value that is halfway between the values for the distances between the centers of destination sites of the bad dies 834 that are bonded to the dummy source dies 924 and 3824. Thus, the overlay error compensations for the source KGD for each direction may be $$OEC_{KGD}=-((OE_{924}+OE_{3824})/2),\text{ where:}$$

$OEC_{KGD}$ is the overlay error compensation for the source KGD, $OE_{924}$ is overlay error for the dummy source die 924, and $OE_{3424}$ is overlay error for the dummy source die 3824.

When the source KGD for the destination die 3924 is moved, the overlay error compensation is in a opposite direction as compared to the overlay errors, and thus, a minus precedes the overlay errors for the dummy source dies 924 and 3824.

Using the values above, the overlay error compensation for the source KGD when positioning it relative to the destination site for the destination die 3924 is:

for the X-direction, $$OEC_{KGD}=-((-0.3\ \mu m-0.1\ \mu m)/2),\text{ or }+0.1\ \mu m,\text{ and}$$

for the Y-direction $$OEC_{KGD}=-((-0.6\ \mu m-0.2\ \mu m)/2),\text{ or }+0.2\ \mu m.$$

At least part of the positioning can include moving the source KGD 0.1 μm closer to the right-hand side of FIG. 39 (compensation for X-direction overlay error) and 0.2 μm closer to the top of FIG. 39 (compensation for the Y-direction overlay error).

When the destination substrate 748 is moved for the source KGD, the movement will be in the same direction as compared to the overlay error. The overlay error compensation when moving the destination substrate 748 is −0.1 μm in the X-direction (from a top view of the destination substrate 748, move the destination substrate 748 0.1 μm closer to the left-hand side) and −0.2 μm in the Y-direction (from a top view of the destination substrate 748, move the destination substrate 748 0.2 μm closer to the bottom).

The prior example with specific numbers is provided to illustrate and improve understanding how overlay errors can be used to determine overlay error compensations and not to limit the scope of the present invention as defined in the claims.

After all desired source dies (dummy source dies and source KGDs) are bonded to the destination substrate 748, a hybrid bonding process can continue. The hybrid bonding process can include three steps that include a bonding operation, a first anneal to cause the metal within the dies and at the destination sites to expand and contact each other, and a second anneal to cause metal atoms to cross the metal-metal interface and reduce contact resistance. The method previously described can correspond to the bonding operation of a hybrid bonding process. The destination substrate 748 can be removed from the apparatus 110 or moved to a different portion of the apparatus 110 or a different tool to perform the anneal operations.

The methods as described with respect to the process flow diagrams in FIGS. 5, 6, 27, and 28 do not need to be performed in the order as presented in such figures. For example, mounting the destination substrate in block 522 may be performed before or after mounting the source substrate in block 524. Further, mounting the destination substrate in block 522 and mounting the source substrate in block 524 may be performed such that at least portions of the mounting actions are performed at the same time. In another implementation, mounting the source substrate in block 524 can be performed after bonding the dummy source die 924 or both dummy source dies 924 and 3824 to the destination substrate 748. Similar to blocks 522 and 524 in FIG. 5, the operations described with respect to blocks 2742 (changing pitch for the die transfer seats) and 2744 (moving the carriage) in FIG. 27 may be performed in either order or such that at least portions of the actions for blocks 2742 and 2744 are performed at the same time. After reading this specification skilled artisans can determine a process flow that meets the needs or desires for a particular application.

Many of the implementations described herein can help with determining an overlay error with respect to a die and a destination site of a destination substrate. A dummy source die can be bonded to a destination site of a destination substrate. The dummy source die does not have any electrical circuit element that is electrically connected to an electrical circuit element within the destination substrate. Accordingly, the dummy source die may not have interconnects or other features that interfere when collecting radiation data after dummy source die is bonded to a destination site. In an implementation, alignment marks within the metrology patterns of the dummy source die may reflect substantially more of the radiation as compared to other parts of the metrology pattern or may transmit substantially less of the radiation as compared to other parts of the metrology pattern.

The radiation can be collected and analyzed. The analysis may or may not include generating an image. When an image is to be generated, further refinements may or may not be used to improve the image. The imaging may be performed with a range of focus that can focus on the alignment marks within the dummy source die and the destination die and produce an image where electrical circuit elements and interconnects in the destination die are not in focus or are blurred out. Pattern recognition may be used so that electrical circuit elements and interconnects below the contact pads in the destination die are not considered when determining an overlay error. Furthermore, spatial frequency analysis can also be used when imaging or when determining the overlay error.

The metrology patterns for the dummy source die and its corresponding destination site can be significantly out of phase to produce a more accurate determination of overlay error. Referring to FIG. 26, the alignment marks 944 and 1744 do not overlap and, in the same or different implementation, are nearly 180° out of phase. Compare the metrology patterns to the bonded contact pads 3724 in FIG. 37. If the metrology patterns were designed to maximize overlap between the alignment marks between the metrology patterns, similar to the bonded active contact pads illustrated in FIG. 37, determining the overlay error is substantially more difficult. Many times, contact pads are made of the same material, such as Cu or Al−1 wt % Cu. The peripheral edges of the contact pads 3726 that overlie the contact pads 3728 may be very difficult to detect. Thus, the out-of-phase arrangement, such as illustrated in FIG. 26, allows for a more accurate determination of overlay error.

The overlay error obtained for the dummy source die and its corresponding destination site may include an X-direction overlay error, a Y-direction overlay error, a rotational overlay error, or any combination thereof. An overlay error compensation can be used for subsequent source dies, such as source KGDs, that will be bonded to the destination substrate, wherein the overlay error compensation can help to reduce the overlay error for the subsequent dies. The overlay error compensation can allow for a greater overlap between the active contact pads of source KGDs to the active contact pads at the destination sites of destination KGDs of the destination substrate. The increase in overlap between active contact pads helps to reduce contact resistance.

More than one dummy source die can be bonded to the destination substrate and provide information regarding drift of the apparatus 110, determine if the overlay error depends on the position where source dies are bonded to destination site of the destination substrate (for example, center-to-edge variation with respect to the destination substrate), or the like.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A method, comprising:

bonding a first dummy source die to a first destination site of a destination substrate, wherein:

the first dummy source die has a first dummy source metrology pattern, and the first destination site has a first destination metrology pattern;

irradiating a first radiation area with a radiation, wherein:

the first radiation area includes at least part of each of the first dummy source metrology pattern and the first destination metrology pattern, within the first radiation area, the first dummy source metrology pattern includes a relatively transmissive portion with respect to the radiation and a relatively non-transmissive portion with respect to the radiation, and with respect to the radiation, a difference in transmission percentages between the relatively transmissive portion and the relatively non-transmissive portion is at least 25%;

collecting first radiation data regarding at least portions of the first dummy source metrology pattern and the first destination metrology pattern within the first radiation area, wherein collecting the first radiation data is performed after bonding the first dummy source die to the first destination site;

analyzing the first radiation data to determine a first overlay error between the first dummy source die and the first destination site; and adjusting a position of a known good source die or a second destination site of the destination substrate to compensate for the first overlay error between the first dummy source die and the first destination site.

2. The method of claim 1, wherein:

during irradiating, no more than 25% of the radiation is transmitted through the relatively non-transmissive portion, and at least 75% of the radiation is transmitted through all of the relatively transmissive portion.

3. The method of claim 1, further comprising irradiating the first radiation area with infrared radiation.

4. The method of claim 1, wherein collecting the first radiation data is performed using a radiation and a radiation detector, wherein the radiation detector has a depth of focus of at most 9 μm with respect to the radiation.

5. The method of claim 1, wherein:

the destination substrate includes a known good destination die and a bad destination die, and the first destination site is at least part of the bad destination die.

6. The method of claim 5, further comprising:

bonding the known good source die to the second destination site of the destination substrate after adjusting the position of the known good source die or the second destination site, wherein the second destination site is at least part of the known good destination die.

7. The method of claim 5, further comprising:

bonding a second dummy source die to a third destination site of the destination substrate, wherein:

the second dummy source die has a second dummy source metrology pattern, and the third destination site die has a second destination metrology pattern;

collecting second radiation data regarding at least portions of the second dummy source metrology pattern and the second dummy source metrology pattern within a second radiation area; and analyzing the second radiation data to determine a second overlay error between the second dummy source die and the third destination site, wherein bonding the second dummy source die, collecting the second radiation data, and analyzing the second radiation data are performed after adjusting the position of the known good source die or the second destination site.

8. The method of claim 1, wherein the first dummy source metrology pattern comprises a first dummy source alignment mark.

9. The method of claim 8, wherein the first destination metrology pattern comprises a first destination alignment mark.

10. The method of claim 8, wherein the first destination metrology pattern comprises a set of contact pads that is not a part of an alignment mark.

11. The method of claim 1, wherein the first dummy source metrology pattern and the first destination metrology pattern comprise areas including arrays of corresponding contact pads.

12. The method of claim 11, wherein the array of contact pads of the first dummy source metrology pattern is phase shifted by an angle in a range from 90° to 270° relative to the array of contact pads of the first destination metrology pattern.

13. The method of claim 11, wherein the array of contact pads of the first dummy source metrology pattern is phase shifted by an angle in a range from 150° to 210° relative to the array of contact pads of the first destination metrology pattern.

14. The method of claim 1, wherein analyzing the first radiation data comprises analyzing a pattern of a first image generated from the first radiation data as compared to a pattern of a standard image.

15. A method, comprising:

bonding a first dummy source die to a first destination site of a destination substrate, wherein:

the first dummy source die has a first dummy source metrology pattern, and the first destination site has a first destination metrology pattern;

irradiating a first radiation area with a radiation, wherein, within the first radiation area, the first dummy source metrology pattern includes a relatively transmissive portion with respect to the radiation and a relatively non-transmissive portion with respect to the radiation, the relatively transmissive portion of the first dummy source metrology pattern includes a substrate, and the relatively non-transmissive portion of the first dummy source metrology pattern includes the substrate and dummy source alignment marks, wherein at least one of the dummy source alignment marks is disposed along a bonding surface of the first dummy source die, and the dummy source alignment marks are only within the relatively non-transmissive portion, and no dummy source alignment mark of the first dummy source metrology pattern is within the relatively transmissive portion;

collecting first radiation data regarding at least portions of the first dummy source metrology pattern and the first destination metrology pattern within the first radiation area, wherein collecting the first radiation data is performed after bonding the first dummy source die to the first destination site;

analyzing the first radiation data to determine a first overlay error between the first dummy source die and the first destination site; and adjusting a position of a known good source die or a second destination site of the destination substrate to compensate for the first overlay error between the first dummy source die and the first destination site.

16. The method of claim 15, wherein:

the first destination metrology pattern comprises destination alignment marks, and during irradiating, no more than 25% of the radiation is transmitted through the destination alignment marks.

17. The method of claim 16, wherein, during bonding, at least one of the dummy source alignment marks does not contact any of the destination alignment marks.

* * * * *